US009136647B2

(12) United States Patent
Straka et al.

(10) Patent No.: US 9,136,647 B2
(45) Date of Patent: Sep. 15, 2015

(54) COMMUNICATION CONNECTOR WITH CROSSTALK COMPENSATION

(71) Applicant: Panduit Corp., Tinley Park, IL (US)

(72) Inventors: Frank M. Straka, Chicago, IL (US); Melanie M. Hagar, Park Forest, IL (US); Masud Bolouri-Saransar, Orland Park, IL (US); Ronald A. Nordin, Naperville, IL (US)

(73) Assignee: Panduit Corp., Tinley Park, IL (US)

( * ) Notice: Subject to any disclaimer, the term of this patent is extended or adjusted under 35 U.S.C. 154(b) by 229 days.

(21) Appl. No.: 13/905,994

(22) Filed: May 30, 2013

(65) Prior Publication Data

US 2014/0011393 A1  Jan. 9, 2014

Related U.S. Application Data

(60) Provisional application No. 61/654,404, filed on Jun. 1, 2012.

(51) Int. Cl.
| | |
|---|---|
| *H01P 1/00* | (2006.01) |
| *H01R 24/00* | (2011.01) |
| *H01R 13/6466* | (2011.01) |
| *H01R 13/6469* | (2011.01) |
| *H05K 1/02* | (2006.01) |

(52) U.S. Cl.
CPC ........ *H01R 13/6466* (2013.01); *H01R 13/6469* (2013.01); *H05K 1/0228* (2013.01); *H05K 1/0239* (2013.01); *H05K 2201/10189* (2013.01)

(58) Field of Classification Search
CPC ............... H01R 24/64; H01R 13/6464; H01R 13/6461; Y10S 439/941; H05K 1/0228

USPC ................. 333/1, 5, 24 C, 260; 439/676, 941
See application file for complete search history.

(56) References Cited

U.S. PATENT DOCUMENTS

| | | | |
|---|---|---|---|
| 5,295,869 | A | 3/1994 | Siemon et al. |
| 5,299,956 | A | 4/1994 | Brownell et al. |
| 5,310,363 | A | 5/1994 | Brownell et al. |
| 5,362,257 | A | 11/1994 | Neal et al. |
| 5,432,484 | A | 7/1995 | Klas et al. |
| 5,459,643 | A | 10/1995 | Siemon et al. |

(Continued)

FOREIGN PATENT DOCUMENTS

WO  2010065588 A1  6/2010

*Primary Examiner* — Dean Takaoka
*Assistant Examiner* — Alan Wong
(74) *Attorney, Agent, or Firm* — Christopher S. Clancy; Yuri Astvatsaturov

(57) ABSTRACT

A communication connector comprising plug interface contacts having a plurality of conductor pairs, and corresponding cable connector contacts. A printed circuit board connects the plug interface contacts to respective cable connector contacts. The printed circuit board includes circuitry between a first conductor pair and a second conductor pair. The circuitry has a first mutually inductive coupling between a first conductor of the first conductor pair and a first conductor of the second conductor pair, a first capacitive coupling between the first conductor of the first conductor pair and the first conductor of the second conductor pair. The first capacitive coupling is approximately concurrent with the first mutually inductive coupling. A shunt capacitive coupling connects the first conductor of the second conductor pair to a second conductor of the second conductor pair.

47 Claims, 13 Drawing Sheets

(56) References Cited

U.S. PATENT DOCUMENTS

| | | |
|---|---|---|
| 5,470,244 A | 11/1995 | Lim et al. |
| 5,474,474 A | 12/1995 | Siemon et al. |
| 5,547,405 A | 8/1996 | Pinney et al. |
| 5,586,914 A | 12/1996 | Foster, Jr. et al. |
| 5,626,497 A | 5/1997 | Bouchan et al. |
| 5,673,009 A | 9/1997 | Klas et al. |
| 5,700,167 A | 12/1997 | Pharney et al. |
| 5,791,943 A | 8/1998 | Lo et al. |
| 5,938,479 A | 8/1999 | Paulson et al. |
| 5,997,358 A | 12/1999 | Adriaenssens et al. |
| 6,023,200 A | 2/2000 | Rhee |
| 6,089,923 A | 7/2000 | Phommachanh |
| 6,099,357 A | 8/2000 | Reichle |
| 6,168,474 B1 | 1/2001 | German et al. |
| 6,176,742 B1 | 1/2001 | Arnett et al. |
| 6,186,834 B1 | 2/2001 | Arnett et al. |
| 6,196,880 B1 | 3/2001 | Goodrich et al. |
| 6,231,397 B1 | 5/2001 | De La Borbolla et al. |
| 6,270,381 B1 | 8/2001 | Adriaenssens et al. |
| 6,283,795 B1 | 9/2001 | Chen |
| 6,356,162 B1 | 3/2002 | DeFlandre et al. |
| 6,379,157 B1 | 4/2002 | Curry et al. |
| 6,435,918 B1 | 8/2002 | Chen |
| 6,443,776 B2 | 9/2002 | Reichle |
| 6,464,529 B1 | 10/2002 | Jensen et al. |
| 6,464,541 B1 | 10/2002 | Hashim et al. |
| 6,533,618 B1 | 3/2003 | Aekins |
| 6,612,880 B2 | 9/2003 | Arnett et al. |
| 6,866,548 B2 | 3/2005 | Hashim |
| 6,916,209 B1 | 7/2005 | Casher et al. |
| 6,964,587 B2 | 11/2005 | Colantuono et al. |
| 7,038,554 B2 | 5/2006 | Seefried |
| 7,048,590 B2 | 5/2006 | Colantuono et al. |
| 7,052,328 B2 | 5/2006 | Ciezak et al. |
| 7,057,899 B2 | 6/2006 | AbuGhazaleh et al. |
| 7,086,909 B2 | 8/2006 | Colantuono et al. |
| 7,140,924 B2 | 11/2006 | Redfield et al. |
| 7,153,168 B2 | 12/2006 | Caveney et al. |
| 7,154,049 B2 | 12/2006 | Celella et al. |
| 7,166,000 B2 | 1/2007 | Pharney |
| 7,168,993 B2 | 1/2007 | Hashim |
| 7,175,476 B2 | 2/2007 | Kim et al. |
| 7,176,383 B2 | 2/2007 | Lauffer et al. |
| 7,179,131 B2 | 2/2007 | Caveney et al. |
| 7,182,649 B2 | 2/2007 | Caveney et al. |
| 7,190,594 B2 | 3/2007 | Hashim et al. |
| 7,201,618 B2 | 4/2007 | Ellis et al. |
| 7,204,722 B2 | 4/2007 | Hashim et al. |
| 7,252,554 B2 | 8/2007 | Caveney et al. |
| 7,265,300 B2 | 9/2007 | Adriaenssens et al. |
| 7,281,957 B2 | 10/2007 | Caveney |
| 7,294,025 B1 | 11/2007 | Chen |
| 7,301,780 B2 | 11/2007 | AbuGhazaleh et al. |
| 7,309,261 B2 | 12/2007 | Caveney et al. |
| 7,314,393 B2 | 1/2008 | Hashim |
| 7,320,624 B2 | 1/2008 | Hashim et al. |
| 7,364,470 B2 | 4/2008 | Hashim |
| 7,367,849 B2 | 5/2008 | Wang et al. |
| 7,381,098 B2 | 6/2008 | Hammond, Jr. et al. |
| 7,384,315 B2 | 6/2008 | Caveney et al. |
| 7,402,085 B2 | 7/2008 | Hammond, Jr. et al. |
| 7,427,218 B1 | 9/2008 | Hashim et al. |
| 7,442,092 B2 | 10/2008 | Caveney et al. |
| 7,452,246 B2 | 11/2008 | Caveney et al. |
| 7,481,681 B2 | 1/2009 | Caveney et al. |
| 7,485,010 B2 | 2/2009 | Aekins |
| 7,500,883 B2 | 3/2009 | Ciezak et al. |
| 7,520,784 B2 | 4/2009 | Caveney et al. |
| 7,537,484 B2 | 5/2009 | Reeves et al. |
| 7,591,686 B2 | 9/2009 | Ellis et al. |
| 7,591,689 B2 | 9/2009 | Caveney et al. |
| 7,618,296 B2 | 11/2009 | Caveney |
| 7,677,930 B2 | 3/2010 | Hashim et al. |
| 7,677,931 B2 | 3/2010 | Aekins |
| 7,682,203 B1 | 3/2010 | Pharney et al. |
| 7,686,650 B2 | 3/2010 | Belopolsky et al. |
| 7,726,018 B2 | 6/2010 | Caveney et al. |
| 7,787,615 B2 | 8/2010 | Hammond, Jr. et al. |
| 7,823,281 B2 | 11/2010 | Caveney et al. |
| 7,824,231 B2 | 11/2010 | Marti et al. |
| 7,841,909 B2 | 11/2010 | Murray et al. |
| 7,850,492 B1 | 12/2010 | Straka et al. |
| 7,854,632 B2 | 12/2010 | Reeves et al. |
| 7,874,878 B2 | 1/2011 | Fite et al. |
| 7,874,879 B2 | 1/2011 | Caveney et al. |
| 7,892,040 B2 | 2/2011 | Ellis et al. |
| 7,909,656 B1 | 3/2011 | Erickson et al. |
| 7,914,345 B2 | 3/2011 | Bopp et al. |
| 7,914,346 B2 | 3/2011 | Pharney et al. |
| 7,927,153 B2 | 4/2011 | Straka et al. |
| 7,955,139 B2 | 6/2011 | Straka et al. |
| 7,967,645 B2 | 6/2011 | Marti et al. |
| 7,976,348 B2 | 7/2011 | Aekins et al. |
| 7,976,349 B2 | 7/2011 | Heckmann |
| 7,980,900 B2 | 7/2011 | Hashim et al. |
| 7,985,103 B2 | 7/2011 | Straka et al. |
| 8,002,571 B2 | 8/2011 | Hogue et al. |
| 8,007,311 B2 | 8/2011 | Hogue et al. |
| 8,011,972 B2 | 9/2011 | Caveney et al. |
| 8,016,621 B2 | 9/2011 | Bopp et al. |
| 8,038,482 B2 | 10/2011 | Erickson et al. |
| 8,047,879 B2 | 11/2011 | Hashim |
| 8,052,483 B1 | 11/2011 | Straka et al. |
| 8,128,437 B2 | 3/2012 | Straka et al. |
| 8,137,141 B2 * | 3/2012 | Straka et al. ............... 439/676 |
| 8,167,661 B2 * | 5/2012 | Straka et al. ............... 439/676 |
| 8,403,709 B2 | 3/2013 | Hammond, Jr. et al. |
| 2007/0238366 A1 | 10/2007 | Hammond, Jr. et al. |
| 2010/0048040 A1 | 2/2010 | Straka et al. |
| 2010/0167859 A1 | 7/2010 | Hammond, Jr. et al. |
| 2010/0317230 A1 | 12/2010 | Larsen et al. |
| 2011/0086549 A1 | 4/2011 | Caveney et al. |
| 2011/0122767 A1 | 5/2011 | Dent |
| 2011/0318970 A1 | 12/2011 | Hammond, Jr. et al. |
| 2012/0003874 A1 | 1/2012 | Reeves et al. |
| 2013/0130560 A1 | 5/2013 | Bolouri-Saransar et al. |

\* cited by examiner

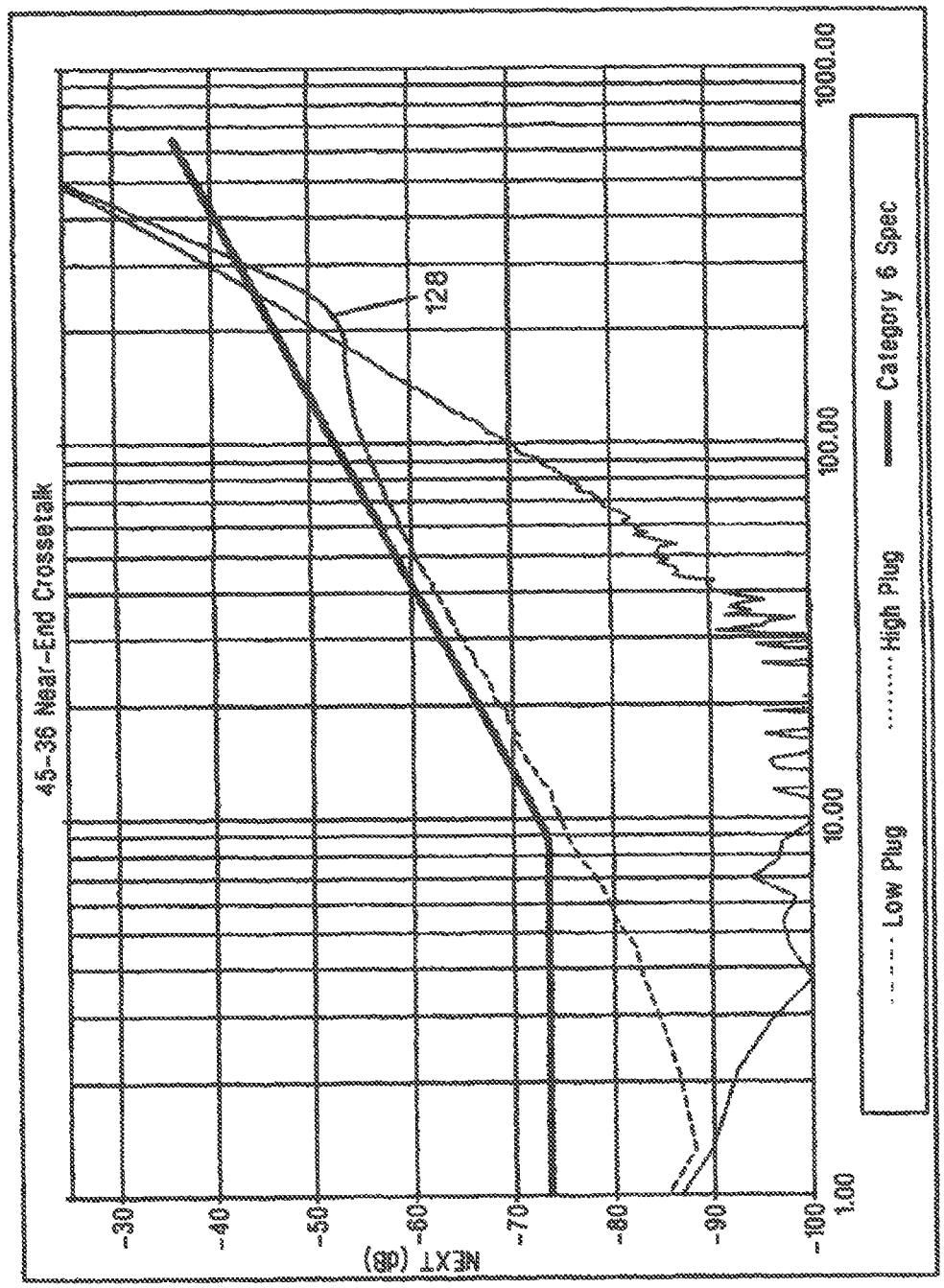
FIG. 11A: Measured 4,5-3,6 NEXT for jack using PCB 126

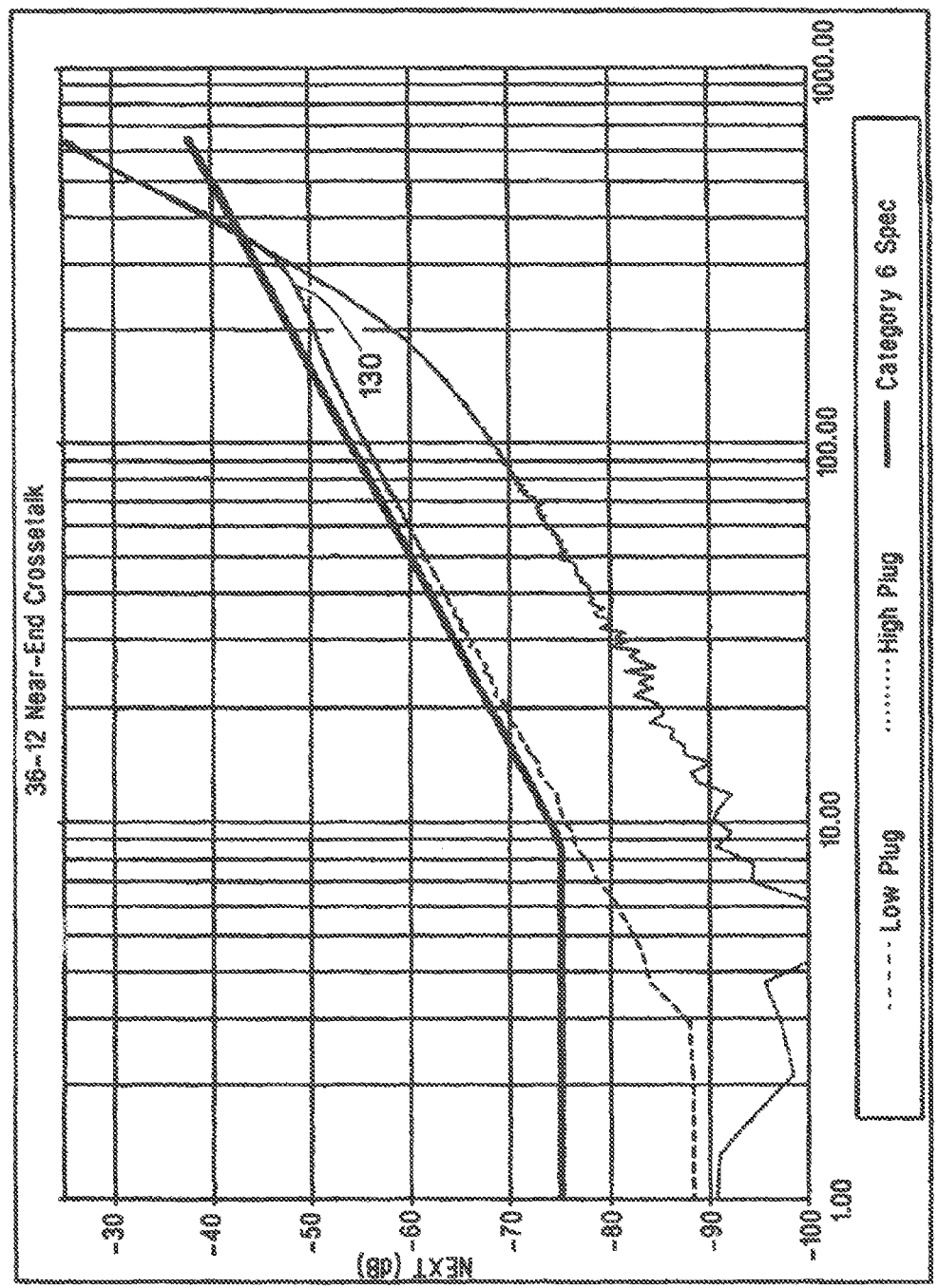
FIG. 11B: Measured 3:6-1:2 NEXT for jack using PCB 126

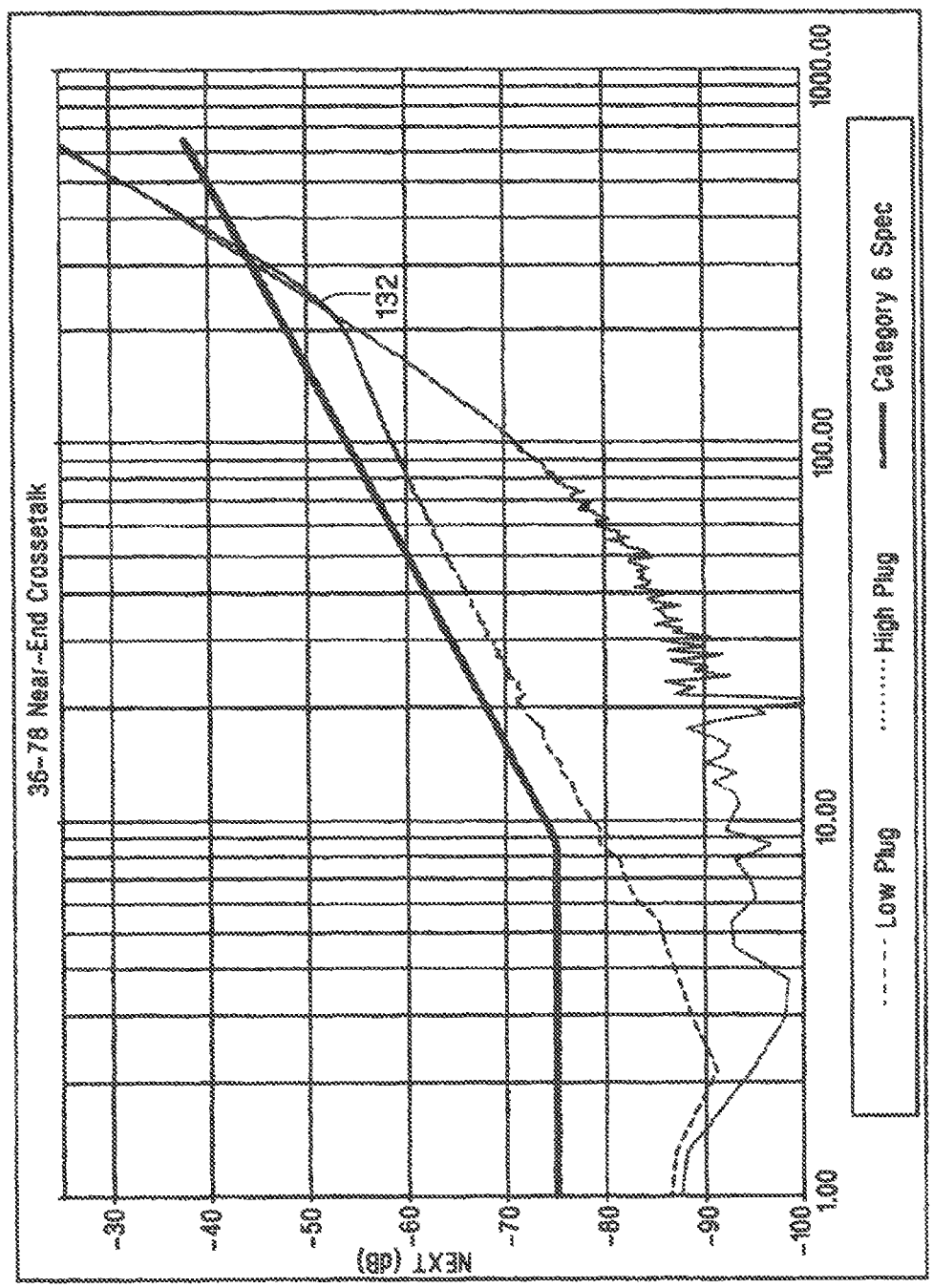
FIG. 11C: Measured 3,6-7,8 NEXT for jack using PCB 126

COMMUNICATION CONNECTOR WITH CROSSTALK COMPENSATION

CROSS-REFERENCE TO RELATED APPLICATIONS

This application claims the benefit of U.S. Provisional Patent Application No. 61/654,404, filed on Jun. 1, 2012, which is incorporated herein by reference in its entirety.

TECHNICAL FIELD

The present invention relates to communication networks and, more particularly, to communication connectors including communication jacks.

BACKGROUND

The evolution of computing has witnessed a significant shift in the importance of networks. An ever-increasing quantity of information is constantly being gathered, stored, and shared among a wide range of users. In addition to the sheer growth of data, users have come to expect quicker access to this information. This combination of size and speed has created a need for network infrastructure capable of supporting a high data rate.

Current networks readily employ jacks and plugs, and other communication connectors. These connectors typically include closely spaced parallel conductors which allow the jack and the plug to interface to each other. Conventional communication connectors have been used in relatively low data rate applications with relatively few problems. However, as transmission frequency and data rates increase, crosstalk (particularly near-end crosstalk (NEXT)) due to capacitive and inductive couplings among the closely spaced parallel conductors within the jack and/or plug has become increasingly problematic, along with other parameters such as return loss and mode conversion.

Therefore, it is desirable to have communication connectors capable of achieving improved performance.

SUMMARY

Accordingly, at least some embodiments of the present invention are generally directed to communication connectors and/or internal components thereof, and their methods of use.

In an embodiment, the present invention comprises a communication connector with plug interface contacts having a plurality of conductor pairs, and corresponding cable connector contacts. A printed circuit board connects the plug interface contacts to respective cable connector contacts. The printed circuit board includes circuitry between a first conductor pair and a second conductor pair. The circuitry has a first mutually inductive coupling between a first conductor of the first conductor pair and a first conductor of the second conductor pair, and a first capacitive coupling between the first conductor of the first conductor pair and the first conductor of the second conductor pair. The first capacitive coupling is approximately concurrent with the first mutually inductive coupling. A shunt capacitive coupling connects the first conductor of the second conductor pair to a second conductor of the second conductor pair.

In another embodiment, the present invention comprises a communication system with communication equipment connected to a communication connector. The communication connector includes plug interface contacts having a plurality of conductor pairs, and corresponding cable connector contacts. A printed circuit board connects the plug interface contacts to respective cable connector contacts. The printed circuit board includes circuitry between a first conductor pair and a second conductor pair. The circuitry has a first mutually inductive coupling between a first conductor of the first conductor pair and a first conductor of the second conductor pair, and a first capacitive coupling between the first conductor of the first conductor pair and the first conductor of the second conductor pair. The first capacitive coupling is approximately concurrent with the first mutually inductive coupling. A shunt capacitive coupling connects the first conductor of the second conductor pair to a second conductor of the second conductor pair.

In yet another embodiment, the present invention comprises a method of compensation between a plurality of conductor pairs in a communication jack. The method includes the steps of: providing a connector including plug interface contacts, cable connector contacts, and circuitry having a plurality of conductor pairs connecting respective plug interface contacts and respective cable connector contacts; capacitively coupling and mutually inductively coupling a first conductor of a first conductor pair to a first conductor of a second conductor pair, and capacitively coupling and mutually inductively coupling a second conductor of the first conductor pair to a second conductor of the second conductor pair; and shifting a phase of the mutually inductive coupling to be approximately orthogonal to the capacitive coupling.

In still yet another embodiment, the present invention comprises a communication connector with plug interface contacts including a plurality of conductor pairs, and corresponding cable connector contacts. Circuitry connects the plug interface contacts to respective cable connector contacts, and the circuitry has signal lines between respective plug interface contacts and respective cable connector contacts. The signal lines have a plurality of signal pairs, and the circuitry includes a first network with a first combined mutually inductive and capacitive coupling between a first conductor of a first signal pair and a first conductor of a second signal pair. The circuitry further includes a second network with a second combined mutually inductive and capacitive coupling between a second conductor of the first signal pair and a second conductor of the second signal pair, and a shunt capacitive coupling connecting the first network with the second network. The shunt capacitive coupling completes a circuit between the first network and the second network, wherein the shunt capacitive coupling is connected between the first conductor of the second signal pair and the second conductor of the second signal pair.

In still yet another embodiment, the present invention is a communication jack mateable to a corresponding plug producing some amount of plug crosstalk. The communication jack includes a first, a second, a third, and a fourth signal conductors, each of the first, the second, the third, and the fourth signal conductors having a respective plug interface contact, a respective insulation displacement contact, and a respective signal trace connecting the respective plug interface contact to the respective insulation displacement contact, where the first and the fourth signal conductors form a first signal-pair, and the second and the third signal conductors form a second signal-pair. The communication jack further includes a first and a second offshoot conductors, each of the first and the second offshoot conductors having a first end and a second end, the first end of the first offshoot conductor being connected to the second signal conductor, the first end of the second offshoot conductor being connected to the third signal conductor, and the second end of the first offshoot conductor being capacitively coupled to the second end of the second offshoot conductor. The communication jack has a first capacitive coupling and a first mutual inductive coupling occurring between at least a portion of the first signal conductor and at least a portion of the first offshoot conductor. Optionally, the communication jack can have a second capacitive coupling and a second mutual inductive coupling occur between at least a portion of the fourth signal conductor and at least a portion of the second offshoot conductor.

In still yet another embodiment, the present invention is a circuit. The circuit includes a first, a second, a third, and a fourth signal trace, the first and the fourth signal traces forming a first signal-pair, and the second and the third signal traces forming a second signal-pair. The circuit further includes a first and a second offshoot traces, each of the first and the second offshoot traces having a first end and a second end, the first end of the first offshoot trace being connected to the second signal trace, the first end of the second offshoot trace being connected to the third signal trace, and the second end of the first offshoot trace being capacitively coupled to the second end of the second offshoot trace. The circuit has a first capacitive coupling and a first mutual inductive coupling occurring between at least a portion of the first signal trace and at least a portion of the first offshoot trace, and a second capacitive coupling and a second mutual inductive coupling occurring between at least a portion of the fourth signal trace and at least a portion of the second offshoot trace.

In still yet another embodiment, the present invention is a method for compensating for undesired crosstalk within a communication jack having a first, a second, a third, and a fourth signal conductors, the first and the fourth signal conductors forming a first signal-pair, and the second and the third signal conductors forming a second signal-pair. The method includes the following steps. Providing a first and a second offshoot conductors, each of the first and the second offshoot conductors having a first end and a second end. Connecting the first end of the first offshoot conductor to the second signal conductor. Connecting the first end of the second offshoot conductor to the third signal conductor. Capacitively coupling the second end of the first offshoot conductor with the second end of the second offshoot conductor. And capacitively and mutual-inductively coupling at least a portion of the first signal conductor with at least a portion of the first offshoot conductor, producing a first capacitive signal and a first mutual inductive signal, respectively. Optionally, the method can include the step of capacitively and mutual inductively coupling at least a portion of the fourth signal conductor with at least a portion of the second offshoot conductor, producing a second capacitive signal and a second mutual inductive signal, respectively.

In still yet another embodiment, the present invention is a circuit for crosstalk compensation. The circuit includes a first, a second, a third, and a fourth signal conductors, where the first and the fourth signal conductors form a first signal-pair, and the second and the third signal conductors form a second signal-pair. The circuit further includes a first offshoot conductor having a first end and a second end, where the first end of the first offshoot conductor is connected to the second signal conductor and the second end of the first offshoot conductor is capacitively coupled to the third signal conductor, and where a first capacitive coupling and a first mutual inductive coupling occur between at least a portion of the first signal conductor and at least a portion of the first offshoot conductor. The circuit of the currently described embodiment may be included in a jack where the each of the first, the second, the third, and the fourth signal conductors have a respective plug interface contact, a respective insulation displacement contact, and a respective signal trace connecting the respective plug interface contact to the respective insulation displacement contact.

In still yet another embodiment, the present invention is a method for compensating for undesired crosstalk within a communication jack having a first, a second, a third, and a fourth signal conductors, the first and the fourth signal conductors forming a first signal-pair, and the second and the third signal conductors forming a second signal-pair. The method includes the steps of providing a first offshoot conductor having a first end and a second end, connecting the first end of the first offshoot conductor to the second signal conductor, capacitively coupling the second end of the first offshoot conductor with the third signal conductor, and capacitively and mutual-inductively coupling at least a portion of the first signal conductor with at least a portion of the first offshoot conductor producing a first capacitive signal and a first mutual inductive signal, respectively.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein:

FIG. 11A illustrates a graph showing measured NEXT for wire-pair combination 4:5-3:6 for a jack using the printed circuit board of FIGS. 8-10;

FIG. 11B illustrates a graph showing measured NEXT for wire-pair combination 3:6-1:2 for a jack using the printed circuit board of FIGS. 8-10; and FIG. 11C illustrates a graph showing measured NEXT for wire-pair combination 3:6-7:8 for a jack using the printed circuit board of FIGS. 8-10.

DETAILED DESCRIPTION

Some embodiments of the present invention may rely in part on the principles of crosstalk compensation disclosed in U.S. patent application Ser. No. 13/681,480 (Bolouri-Saransar et al.), filed on Nov. 20, 2012, entitled "COMPENSATION NETWORK USING AN ORTHOGONAL COMPENSATION NETWORK," and incorporated herein by reference in its entirety.

As used herein, "opposite polarity" can be defined as being approximately 180 degrees out of phase in relation to a referenced polarity, and "orthogonal" can be defined as being approximately 90 degrees out of phase in relation to a referenced polarity. Also, as used herein, references to "shunting" can be defined as direct or indirect coupling of two conductors of the same differential pair via some means. For example, a shunting capacitive coupling on a wire-pair (e.g., 3:6 wire-pair) can refer to some form of a capacitive coupling (e.g., pad capacitor) positioned between a first conductor (e.g., conductor 3) and second conductor (e.g., conductor 6) of that wire pair. Note that indirect coupling may include intervening components such as offshoot traces. Furthermore, "conductor(s)," "signal conductor(s)," and "signal trace(s)" may be used interchangeably and shall be understood to refer to the same feature.

Figure 1A:
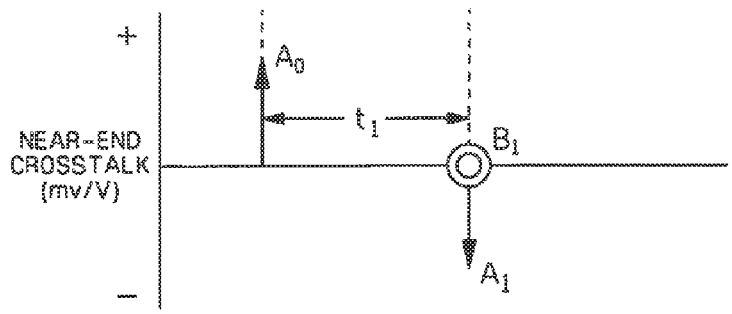
FIG. 1A illustrates a lumped vector diagram of a compensation method according to an embodiment of the present invention.

An embodiment of a compensation method, in accordance with the present invention, is represented using a vector diagram illustrated in FIG. 1A. Note that this vector diagram is designed to show the approximate polarity of the coupling occurring in given sections. The separation between the vectors and the magnitudes of the vectors are not intended to be precise or to show approximate distances or magnitudes, but are instead shown for exemplary and illustrative purposes. In this figure, vector $A_0$ generally represents the undesired NEXT of a communication connector (such as a plug having its plug contacts laid out in accordance with ANSI/TIA-568-C.2), and lumped compensation vectors $A_1$ and $B_1$ (with vector $B_1$ [shown as coming out of the page] being orthogonal to vector $A_1$) generally represent compensation signals produced by a compensation circuit such as the circuit 100 of FIG. 1B (which may be a circuit in a communication jack). Compensation vectors $A_1$ and $B_1$ are located in approximately the same section and experience approximately the same time-delay $t_1$ from the offending crosstalk vector $A_0$. Note that time-delay $t_1$ is not generally necessary but, from a practical point of view, will generally exist as there will be an electrical distance from the source of the crosstalk $A_0$ to a compensation circuit producing compensation signals represented by the $A_1$ and $B_1$ vectors.

Figure 1B:
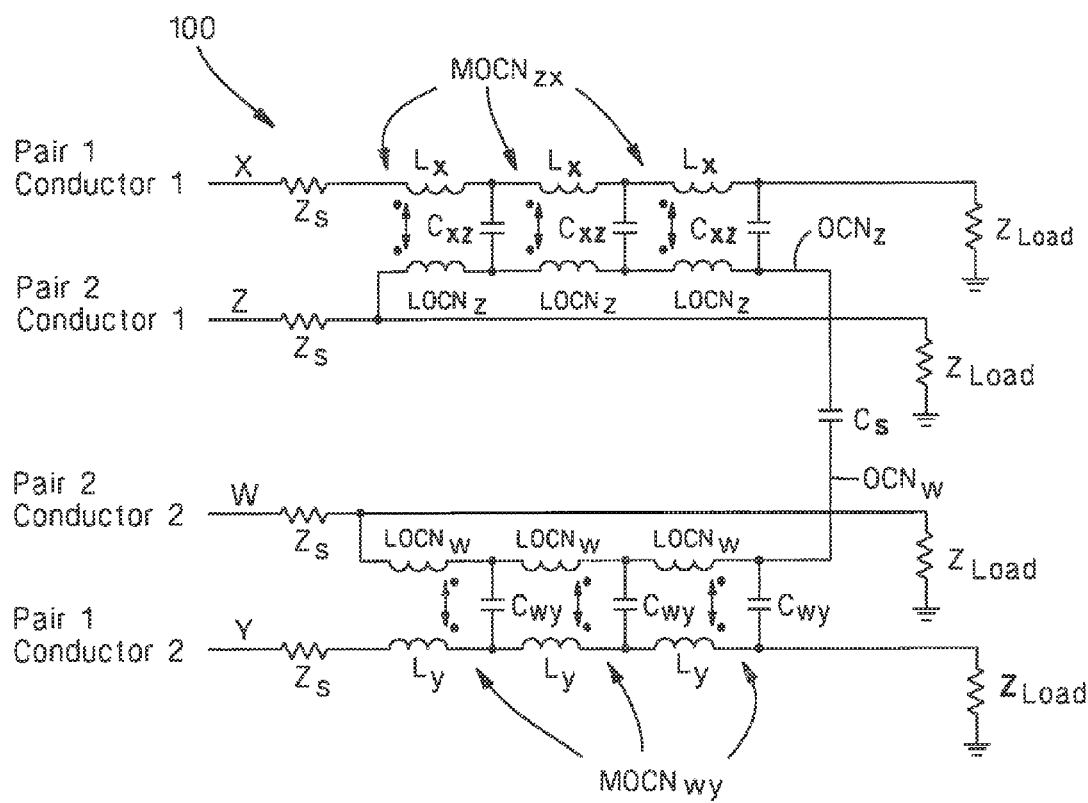
FIG. 1B illustrates a generalized schematic for a compensation method for a general wire-pair combination according to an embodiment of the present invention.

The circuit 100 of FIG. 1B is a schematic illustration of a generalized compensation circuit for two signal pairs, according to an embodiment of the present invention. While the schematic of FIG. 1B illustrates inductors and capacitors as discrete elements, such a representation should not be considered limiting. The capacitive and/or inductive couplings shown on FIG. 1B, may be achieved by way of at least one of: (a) distributed coupling occurring as a result of two traces running within proximity of each other; (b) coupling occurring as a result of discrete elements such as, but not limited to, pad capacitors, finger capacitors, or other discrete capacitors; and (c) a combination of (a) and (b).

The circuit 100 of FIG. 1B includes signal traces X, Y, Z, and W, wherein traces X and Y correspond to a first signal-wire-pair, and traces Z and W correspond to a second signal-wire-pair. In an embodiment where the circuit 100 is implemented in a jack adapted to mate with a plug having its plug contacts laid out in accordance with ANSI/TIA-568-C.2, traces X and Y of the first wire-pair can correspond to the traces making contact with plug contacts 5 and 4, respectively, of the 4:5 wire-pair; and traces Z and W of the second wire-pair can correspond to the traces making contact with plug contacts 3 and 6, respectively, of the 3:6 wire-pair. Conversely, in such an embodiment, the offending NEXT represented by vector $A_0$ (see FIG. 1A) is a result of coupling occurring between conductors 3 and 4, and 5 and 6 in the plug contacts region of the plug and/or the plug interface contacts region of the jack. In addition to the signal traces, circuit 100 includes traces $OCN_Z$ and $OCN_W$ connected by a capacitive coupling $C_S$ (e.g., discrete capacitor). The $OCN_Z$ and $OCN_W$ traces may be referred to as "offshoot traces," and may span more than one layer of a circuit board and include connecting vias. Traces X, Y, $OCN_Z$, and $OCN_W$ generate self-inductances $L_X$, $L_Y$, $LOCN_Z$, and $LOCN_W$, respectively. As a result of electrical coupling, there exists capacitive and mutual inductive coupling between various traces of the circuit 100, causing said circuit to provide a compensation signal.

In particular, traces X and $OCN_Z$, and Y and $OCN_W$ produce capacitive couplings $C_{XZ}$ and $C_{YW}$, respectively. These capacitive couplings produce a net compensation vector $A_1$ with a polarity that is opposite of the polarity of the offending crosstalk vector $A_0$. Additionally, the capacitive element $C_S$ provides a current path between and allows current to flow through the offshoot traces $OCN_Z$ and $OCN_W$. When current flows through signal traces X and Y, mutual inductances $MOCN_{ZX}$ (between traces X [$L_X$] and $OCN_Z$ [$LOCN_Z$]) and $MOCN_{WY}$ (between traces Y [$L_Y$] and $OCN_W$ [$LOCN_W$]) induce current on offshoot traces $OCN_Z$ and $OCN_W$, respectively, exciting the resistor-capacitor circuit comprised of $Z_S$ (source impedance) present on signal traces Z and W, and capacitive element $C_S$. The current passes through $Z_S$ of trace Z, $Z_S$ of trace W, and capacitive element $C_S$ (turning on vector $B_1$), and creates a voltage (vector $B_1$) across $Z_S$ of trace Z, $Z_S$ of trace W, and capacitive element $C_S$. By having capacitive element $C_S$ in parallel with $Z_S$ on traces Z and W, the voltage from the induced current experiences a phase shift of approximately 90 degrees (also referred to as orthogonal) relative to the capacitive coupling from $C_{XZ}$ and $C_{YW}$. Therefore, the mutual inductive couplings $MOCN_{ZX}$ and $MOCN_{WY}$ (collectively producing vector $B_1$) act as a compensation signal which is approximately concurrent with and approximately orthogonal to the compensation signal produced by the $C_{XZ}$ and $C_{YW}$ capacitive couplings (collectively producing vector $A_1$).

The result of inductive couplings $MOCN_{ZX}$ and $MOCN_{WY}$ being created in generally the same physical location as capacitive couplings $C_{XZ}$ and $C_{YW}$, and the consequential approximately concurrent occurrence of vectors $A_1$ and $B_1$, is that compensation vectors $A_1$ and $B_1$ are located at approximately the same time-delay $t_1$ from the offending crosstalk $A_0$. The addition of vector $B_1$ may allow the NEXT bandwidth to extend past 250 MHz. Furthermore, apparatuses and methods incorporating compensation circuits in accordance with the present invention may exhibit improvements in return loss, differential-to-common-mode conversion, and common-to-differential-mode conversion.

Figure 2:
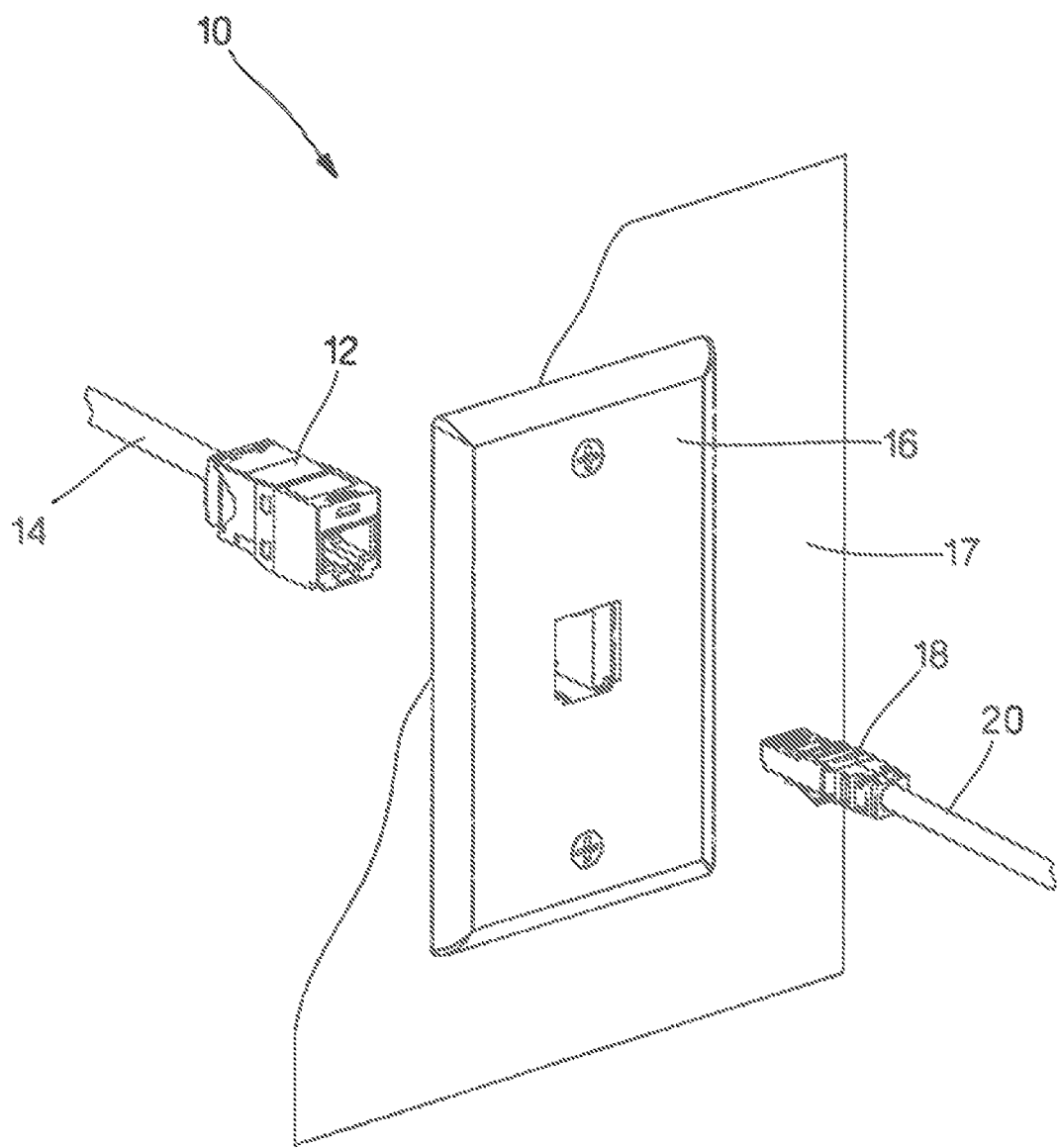
FIG. 2 illustrates a perspective view of a communication system according to an embodiment of the present invention.

FIG. 2 illustrates a communication jack 12 in a communication system 10, according to one embodiment of the present invention, where system 10 includes an outlet 16 attached to a wall 17 with the jack 12 and a corresponding plug 18. In other embodiments the outlet 16 may be replaced with other passive equipment (such as, but not limited to, modular patch panels, punch-down patch panels, coupler patch panels, etc.) or active equipment (such as, but not limited to, Ethernet switches, routers, servers, physical layer management systems, and power-over-Ethernet equipment as can be found in data centers and/or telecommunications rooms; security devices (cameras and other sensors, etc.) and door access equipment; and telephones, computers, fax machines, printers and other peripherals as can be found in workstation areas). A jack cable 14 is terminated to the far end of jack 12, and a plug cable 20 is terminated to the far end of plug 18. Once the plug 18 mates with the jack 12, data can flow in both directions through these components.

Figure 3:
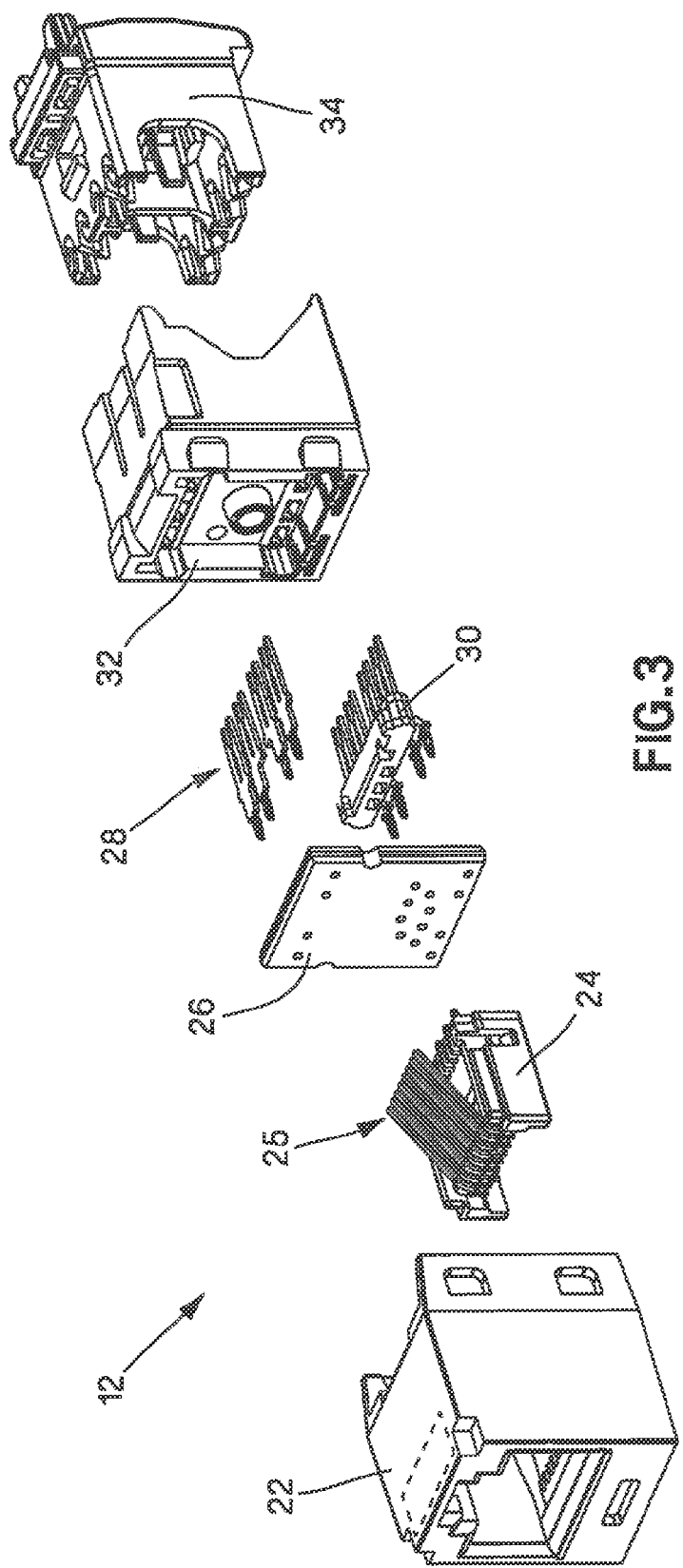
FIG. 3 illustrates an exploded view of a communication jack used in the communication system of FIG. 2, according to an embodiment of the present invention.

As shown in FIG. 3, in one embodiment, jack 12 includes a front housing 22, a front sled 24, plug interface contacts (PICS) 25, a printed circuit board (PCB) 26, insulation displacement contacts (IDCs) 28, an IDC support 30, a rear sled 32, and a wire cap 34. Other elements, details, and/or exemplary embodiments of jack 12 can be found in U.S. Pat. No. 7,052,328 (Ciezak et al.), entitled "Electronic Connector And Method Of Performing Electronic Connection," issued on May 30, 2006; U.S. Pat. No. 7,481,681 (Caveney et al.), entitled "Electrical Connector With Improved Crosstalk Compensation," issued on Jan. 27, 2009; U.S. Pat. No. 7,452, 245 (Doorhy et al.), entitled "Wire Containment Cap," issued on Nov. 18, 2008; and U.S. Pat. No. 7,476,120 (Patel et al.), entitled "Wire Containment Cap With Integral Strain Relief Clip," issued on Jan. 13, 2009, all of which are incorporated herein by reference in their entirety.

Figure 4:
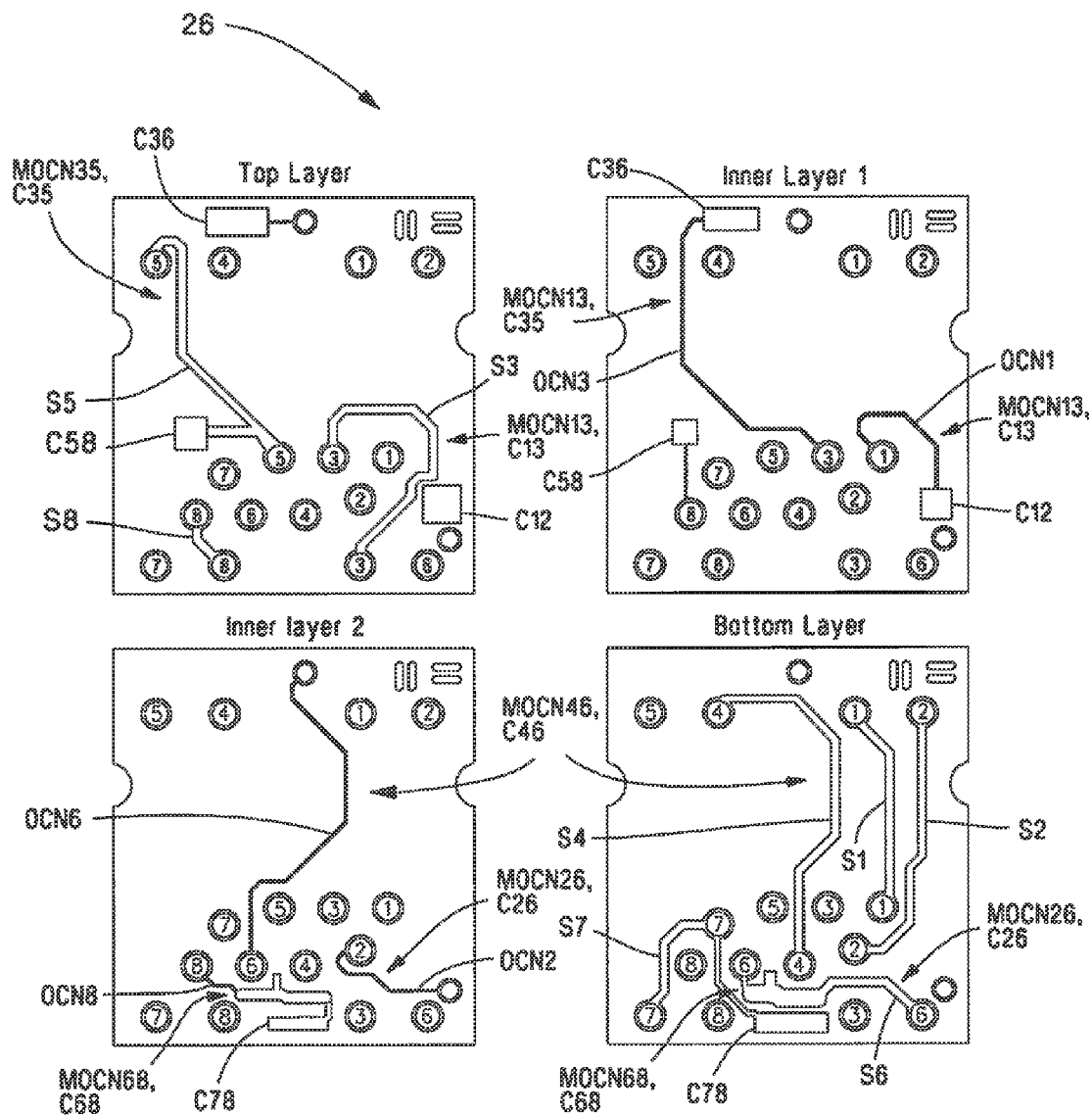
FIG. 4 illustrates top views of four conductive layers of a printed circuit board of the jack of FIG. 3, according to an embodiment of the present invention.
Figure 5:
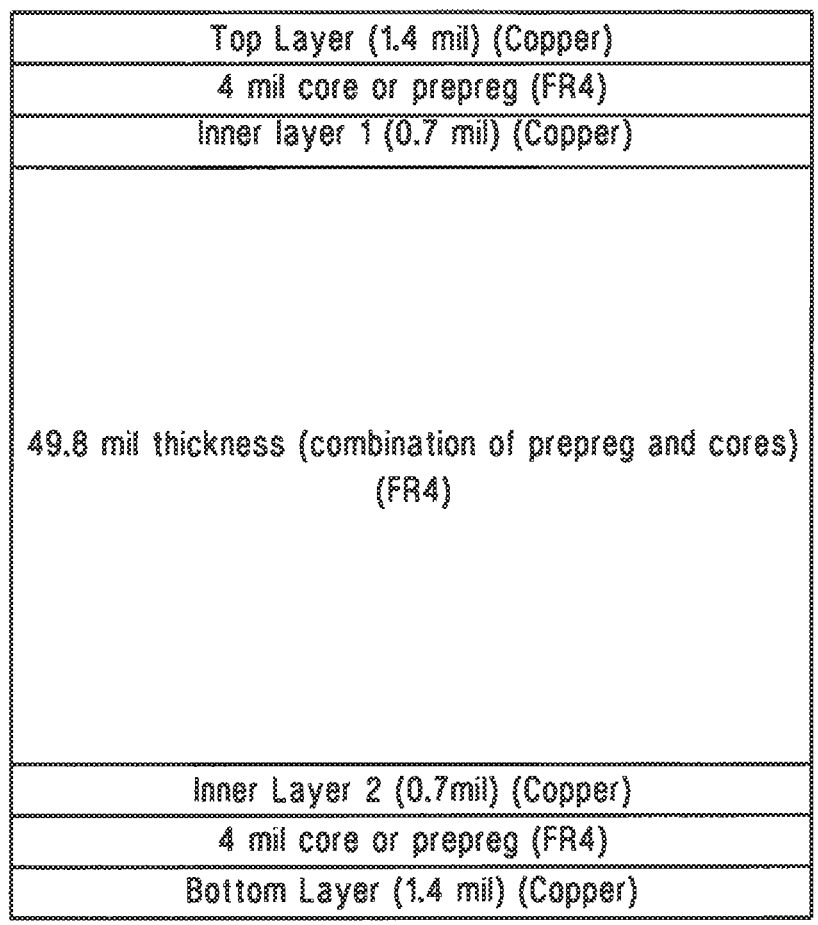
FIG. 5 illustrates a printed circuit board stack-up according to an embodiment of the present invention.
Figure 6:
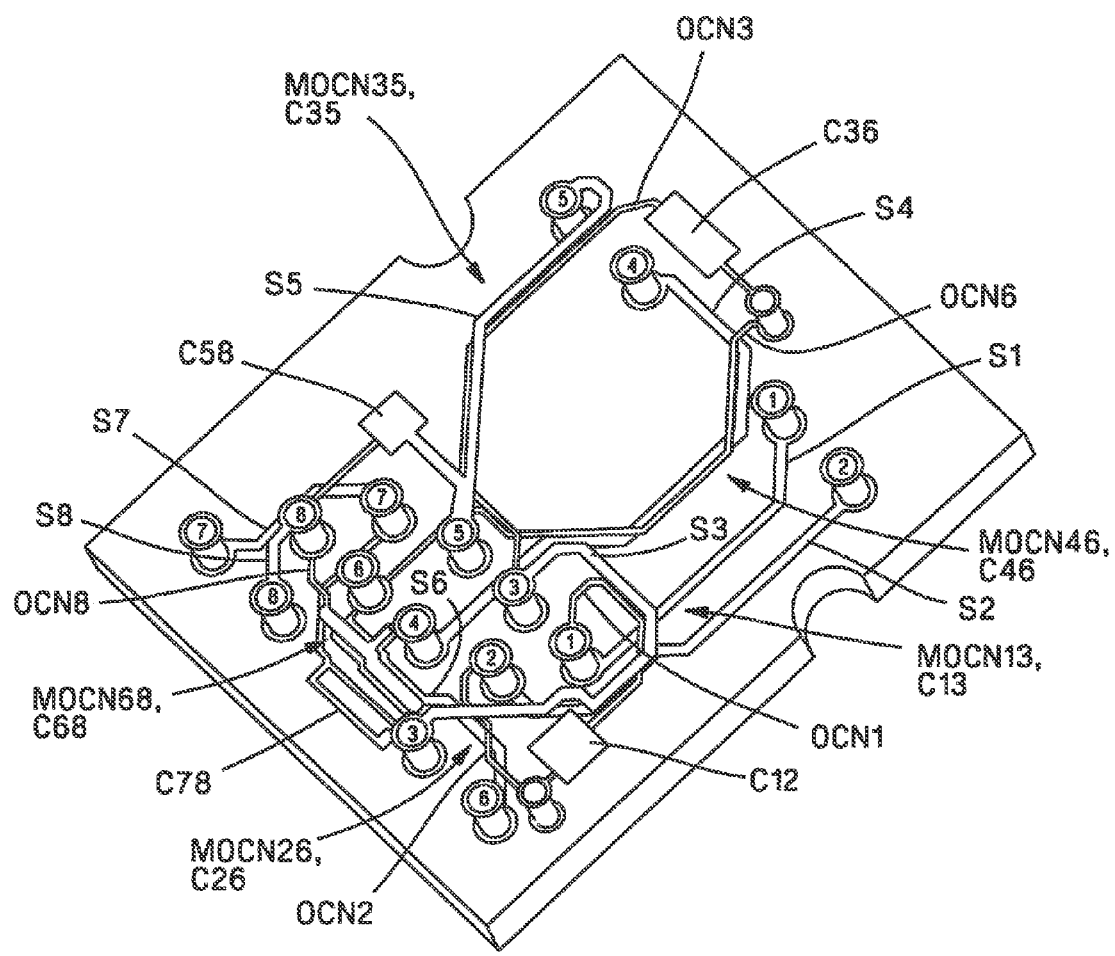
FIG. 6 illustrates an isometric view of an assembled printed circuit board of FIGS. 4 and 5.
Figure 7:
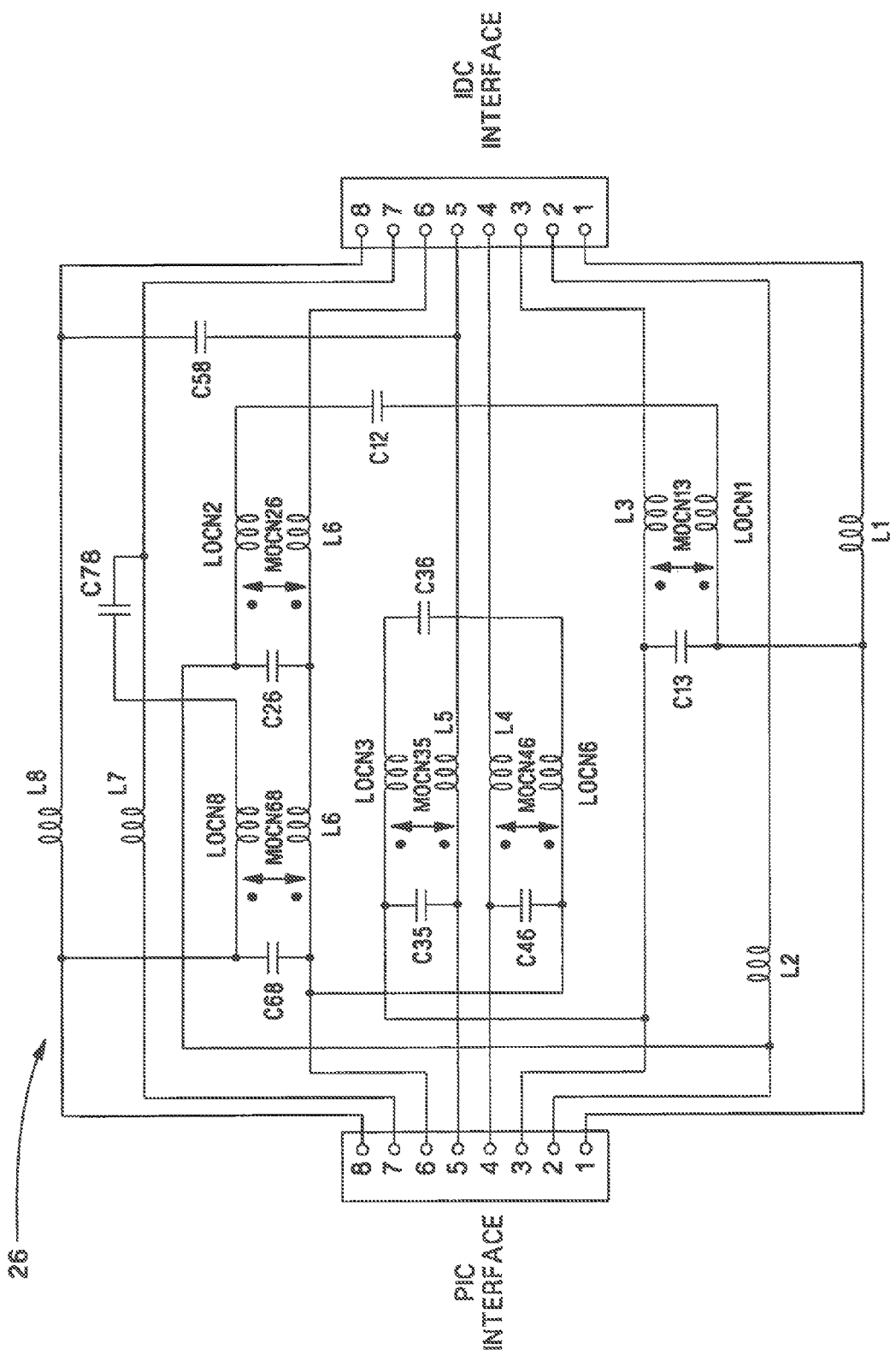
FIG. 7 illustrates a schematic view of the printed circuit board of FIG. 6.

An embodiment of PCB 26, which includes multiple embodiments of the orthogonal compensation network thereon, is shown in FIGS. 4-7. FIG. 4 illustrates the individual layers of the PCB 26. In this embodiment, PCB 26 can use the stack-up shown in FIG. 5. PCB 26 can have a 4-layer (copper layers) construction, with capacitors being formed by the top layer and inner layer 1, and the bottom layer and inner layer 2. This may be achieved by using a 4-mil core or prepreg (partially cured FR4 without copper cladding, for example) at the top and bottom of PCB 26 and standard circuit board assembly materials within the rest of the circuit board. An isometric view of PCB 26 is shown in FIG. 6, and a corresponding schematic is shown in FIG. 7.

While the schematic of FIG. 7 illustrates inductors and capacitors as discrete elements, in at least one embodiment, at least some of these elements represent the capacitive and inductive coupling occurring between various electrical traces. Such coupling is generally distributed and may, for example, include: (a) distributed coupling occurring as a result of two traces running within proximity to each other; (b) coupling occurring as a result of discrete elements such as, but not limited to, pad capacitors, finger capacitors, or other discrete capacitors; or (c) a combination of (a) and (b).

PCB 26 includes signal traces S1, S2, S3, S4, S5, S6, S7, and S8. The S1-S8 traces respectively correspond to traces making contact with the $1^{st}$-$8^{th}$ plug contacts of a plug having its contacts laid out in accordance with ANSI/TIA-586-C.2, and electronically connect the respective PICs 25 to the respective IDCs 28. These traces generate self-inductances L1, L2, L3, L4, L5, L6, L7, and L8, wherein inductances L1-L8 correspond to the individual traces S1-S8, respectively. Additionally, PCB 26 includes traces to connect signal traces S1, S2, S3, S6, S7, and S8 to capacitors C12, C36, and C78. In alternate embodiments, capacitors C12, C36, and C78 may be realized by way of distributed capacitive coupling; discrete elements, including, but not limited to, pad capacitors and finger capacitors; or any combination of distributed capacitive coupling and discrete elements. Additionally, capacitors C12, C36, and C78 may be referred to as "shunt capacitors," as they couple two conductors of the same signal pair. Furthermore, the traces connecting the signal traces S1, S2, 53, S6, S7, and S8 to capacitors C12, C36, and C78 may be referred to as "offshoot traces." These offshoot traces may span more than a single layer of the PCB 26 and can includes interconnecting vias such as the vias for PIC conductors 1, 2, 3, 6, 7, and 8. At least some of the offshoot traces comprise traces OCN1, OCN2, OCN3, OCN6, and OCN8, which create self-inductances LOCN1, LOCN2, LOCN3, LOCN6, and LOCN8, respectively. References to the offshoot, S, and OCN traces may include any portions thereof including portions which are wider and/or narrower with respect to the general width of any respective trace (for example, portions which may be said to form a part of a pad capacitor).

The result of the signal S traces being within a proximity to the OCN traces is mutual inductive coupling between the respective S and OCN traces. In particular, MOCN13 in PCB 26 is the mutual inductive coupling between S3 (L3) and OCN1 (LOCN1); MOCN26 in PCB 26 is the mutual inductive coupling between S6 (L6) and OCN2 (LOCN2); MOCN46 in PCB 26 is the mutual inductive coupling between S4 (L4) and OCN6 (LOCN6); MOCN35 in PCB 26 is the mutual inductive coupling between S5 (L5) and OCN3 (LOCN3); and MOCN68 in PCB 26 is the mutual inductive coupling between S6 (L6) and OCN8 (LOCN8). Another result of the S traces being within a proximity to the OCN traces is capacitive coupling between the respective S and OCN traces. In particular, C13 in PCB 26 is the capacitive coupling between traces S3 and OCN1; C26 in PCB 26 is the capacitive coupling between traces S6 and OCN2; C46 in PCB 26 is the capacitive coupling between traces S4 and OCN6; C35 in PCB 26 is the capacitive coupling between traces S5 and OCN3; and C68 in PCB 26 is the capacitive coupling between traces S6 and OCN8.

For wire-pair combination 4:5-3:6, the orthogonal compensation network located on the PCB 26 uses traces S4, S5, OCN3, and OCN6, and capacitor C36 to create the desired signal. Traces S4 and OCN6 create the capacitive coupling C46, and traces S5 and OCN3 create the capacitive coupling C35. Each capacitive coupling C46 and C35 is approximately 0.7 pF (picoFarad)+/−0.05 pF, and together produce a net compensation vector $A_1$ of an opposite polarity of the offending crosstalk vector $A_0$ (see FIG. 1A for reference). Capacitor C36 (approximately 1 pF+/−20%) provides a current path between traces OCN3 and OCN6, allowing mutual inductive coupling MOCN46 (approximately 6.2 nH (nanoHenry)+/− 0.5 nH) to occur between traces S4 and OCN6, and mutual inductive coupling MOCN35 (approximately 4.9 nH+/−0.5 nH) to occur between traces S5 and OCN3. Inductive couplings MOCN46 and MOCN35 are created in generally the same physical locations as capacitive couplings C46 and C35, and together, in combination with capacitor C36, produce a compensation vector $B_1$ (see FIG. 1A for reference). Because of the C36 capacitor, vector $B_1$ is phase-shifted and becomes orthogonal to the compensation vector $A_1$ produced by the C46 and C35 capacitive couplings. The net resultant vector of couplings C35, C46, MOCN35, MOCN46, and C36 provides additional NEXT bandwidth which may help to allow wire-pair combination 4:5-3:6 to meet standards for Category 5E and beyond.

For wire-pair combination 3:6-1:2, the orthogonal compensation network located on the PCB 26 uses traces S3, S6, OCN1, and OCN2, and capacitor C12 to create the desired signal. Traces S3 and OCN1 create the capacitive coupling C13, and traces S6 and OCN2 create the capacitive coupling C26. Each capacitive coupling C13 and C26 is approximately 0.4 pF+/−0.05 pF, and together produce a net compensation vector $A_1$ of an opposite polarity of the offending crosstalk vector $A_0$ (see FIG. 1A for reference). Capacitor C12 (approximately 1 pF+/−20%) provides a current path between traces OCN1 and OCN2, allowing mutual inductive coupling MOCN13 (approximately 2.1 nH+/−0.5 nH) to occur between traces S3 and OCN1, and mutual inductive coupling MOCN26 (approximately 1.2 nH+/−0.5 nH) to occur between traces S6 and OCN2. Inductive couplings MOCN13 and MOCN26 are created in generally the same physical locations as capacitive couplings C13 and C26, and together, in combination with capacitor C12, produce a net compensation vector $B_1$ (see FIG. 1A for reference). Because of the C12 capacitor, vector $B_1$ is phase-shifted and becomes orthogonal to the compensation vector $A_1$ produced by the C13 and C26 capacitive couplings. The net resultant vector of couplings C13, C26, MOCN13, MOCN26, and C12 provides additional NEXT bandwidth which may help to allow wire-pair combination 3:6-1:2 to meet standards for Category 5E and beyond.

For wire-pair combination 3:6-7:8, the orthogonal compensation network located on the PCB 26 uses traces S6 and OCN8, and capacitor C78 to create the desired signal. Traces S6 and OCN8 create capacitive coupling C68, which is approximately 0.9 pF+/−0.05 pF, and which produces a compensation vector $A_1$ of an opposite polarity of the offending crosstalk vector $A_0$ (see FIG. 1A for reference). Capacitor C78 (approximately 1 pF+/−20%) provides a current path between traces OCN8 and S7, allowing mutual inductive coupling MOCN68 (approximately 1.1 nH+/−0.05 nH) to occur between traces S6 and OCN8. Inductive coupling MOCN68 is created in generally the same physical location as capacitive coupling C68, and in combination with capacitor C78 produces a compensation vector $B_1$ (see FIG. 1A for reference). Because of the C78 capacitor, vector $B_1$ is phase-shifted and becomes orthogonal to the compensation vector $A_1$ produced by the C68 capacitive coupling. The net resultant vector of couplings C68, MOCN68, and C78 provides additional NEXT bandwidth which may help to allow wire-pair combination 3:6-7:8 to meet standards for Category 5E and beyond.

Note that in the embodiment of the compensation network implemented on the 3:6-7:8 wire-pair combination, coupling between signal and offshoot traces occurs only between two conductors of the wire-pair combination (in this case between conductors 6 and 8) rather than all four conductors (such as the coupling for wire-pair combination 4:5-3:6). Thus, embodiments of the present invention can be directed to coupling of only two conductors of a four conductor wire-pair combination.

For wire-pair combination 4:5-1:2, the PCB 26 provides a compensation vector of an opposite polarity to the offending crosstalk vector. The coupling on the PCB 26 represented by the compensation vector is created by the mutual inductive coupling created by the proximity of traces S1 and S4. This coupling may help to allow wire-pair combination 4:5-1:2 to meet standards for Category 5E and beyond.

For wire-pair combination 4:5-7:8, the PCB 26 provides a compensation vector of an opposite polarity to the offending crosstalk vector. This vector is produced by the coupling occulting at the C58 capacitor (approximately 0.5 pF+/−0.05 pF). In alternate embodiments, capacitor C58 may be realized by way of distributed capacitive coupling; discrete elements, including, but not limited to, pad capacitors and finger capacitors; or any combination of distributed capacitive coupling and discrete elements. Capacitor C58 may help to allow wire-pair combination 4:5-7:8 to meet standards for Category 5E and beyond.

A summary of the circuit elements of PCB 26 and how they generally relate to vectors $A_1$ and $B_1$ is given in Table 1 below.

TABLE 1

Relationship of PCB 26 Circuit Elements and $A_1$ and $B_1$ Vectors:

| Pair Combination | $A_1$ Vector | $B_1$ Vector | |
|---|---|---|---|
| | | Capacitor | Mutual Inductive Coupling |
| 4:5-3:6 | C35, C46 | C36 | MOCN35, MOCN46 |
| 3:6-1:2 | C13, C26 | C12 | MOCN13, MOCN26 |
| 3:6-7:8 | C68 | C78 | MOCN68 |
| 4:5-1:2 | M14 | N/A | N/A |
| 4:5-7:8 | C58 | N/A | N/A |
| 1:2-7:8 | N/A | N/A | N/A |

Figure 8:
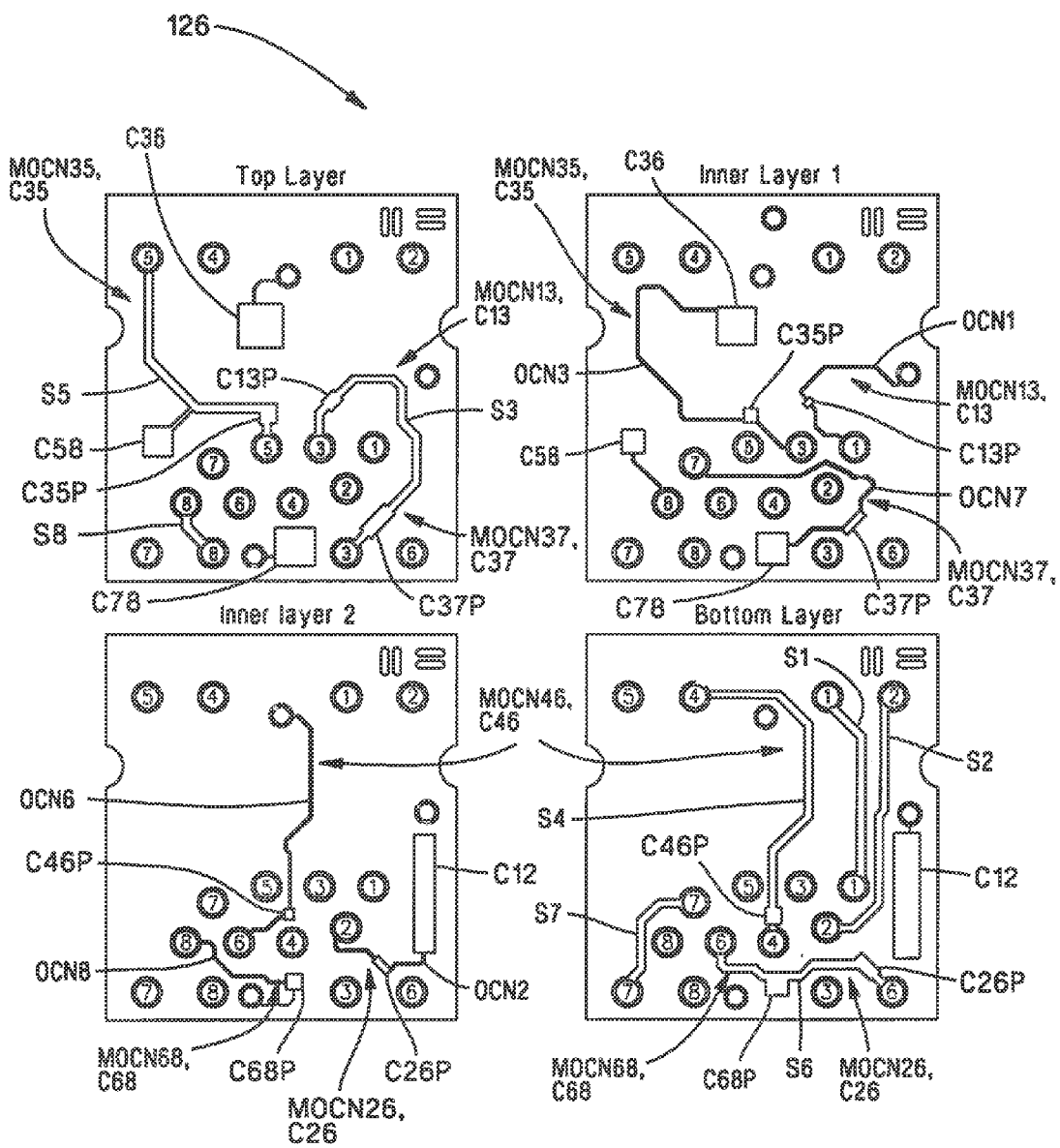
FIG. 8 illustrates top views of four conductive layers of a printed circuit board according to another embodiment of the present invention.
Figure 9:
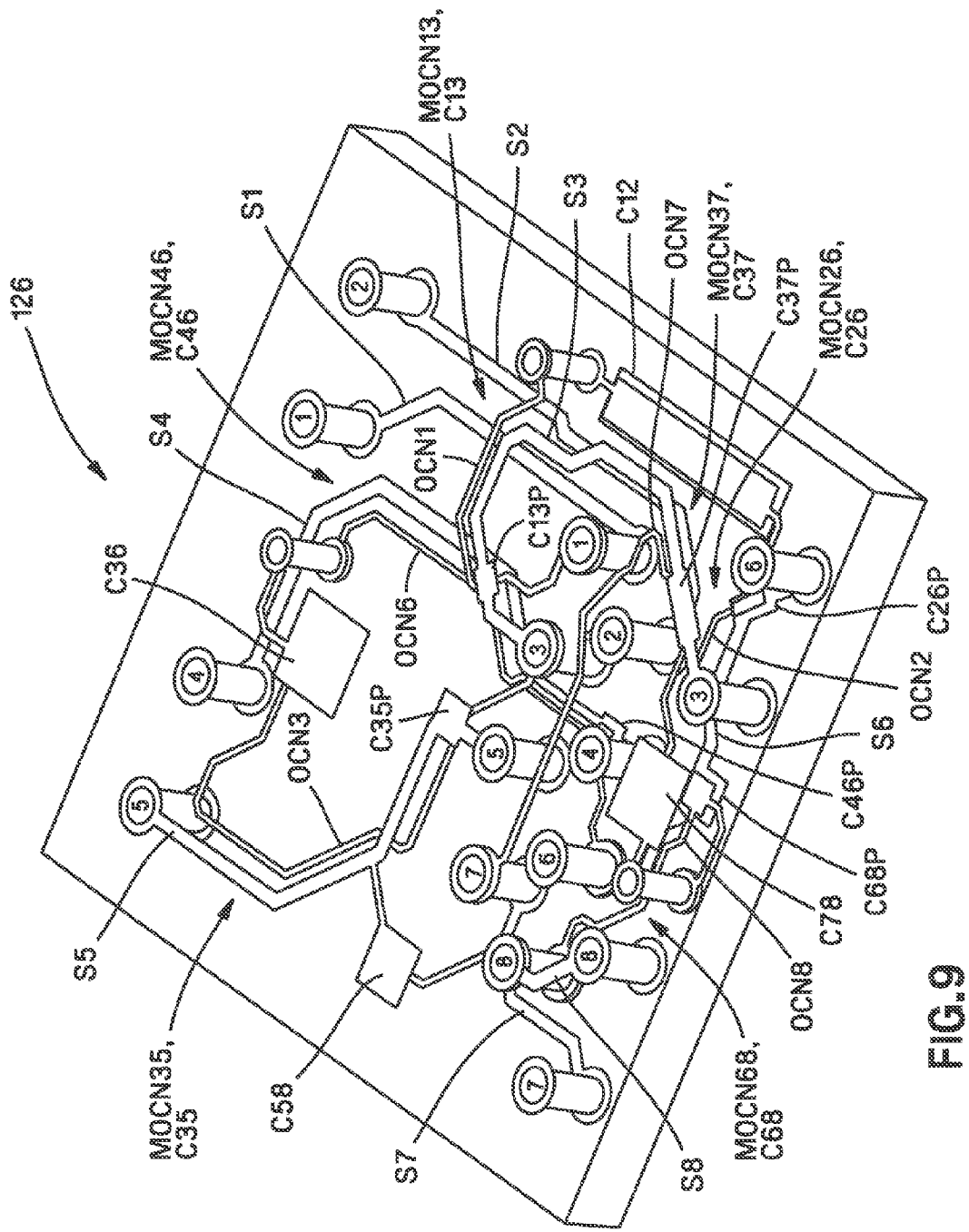
FIG. 9 illustrates an isometric view of an assembled printed circuit board of FIG. 8.
Figure 10:
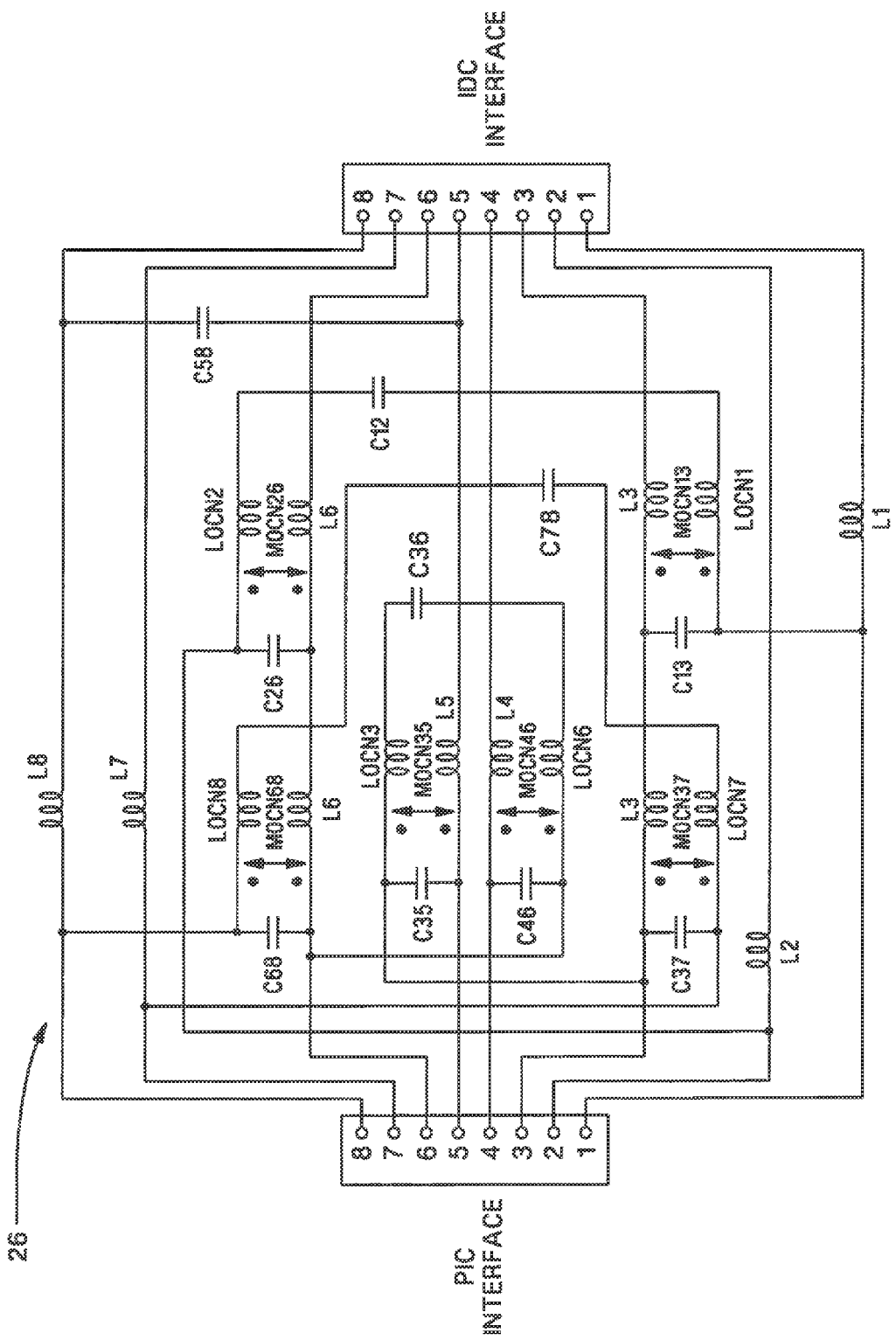
FIG. 10 illustrates a schematic view of the printed circuit board of FIG. 9.

Another embodiment of a compensation PCB according to the present invention is shown in FIGS. 8-10 as PCB 126. PCB 126 can be used in jack 12 by replacing PCB 26. Similar reference characters are used in FIGS. 8-10 to describe the elements of PCB 126 as were used to describe the elements of PCB 26, although the construction and values of the circuit elements may be different in PCB 126 when compared to PCB 26. FIG. 8 shows the individual layers of PCB 126. In this embodiment, PCB 126 is built using the same stack-up as previously shown in FIG. 5. An isometric view of PCB 126 is shown in FIG. 9, and a corresponding schematic of PCB 126 is shown in FIG. 10.

While the schematic of FIG. 10 illustrates inductors and capacitors as discrete elements, in at least one embodiment, at least some of these elements represent the capacitive and inductive coupling occurring between various electrical traces. Such coupling is generally distributed and may, for example, include: (a) distributed coupling occurring as a result of two traces running within proximity to each other; (b) coupling occurring as a result of discrete elements such as, but not limited to, pad capacitors, finger capacitors, or other discrete capacitors; or (c) a combination of (a) and (b).

The PCB 126 includes signal traces S1, S2, S3, S4, S5, S6, S7, and S8 that connect the respective PICs 25 to the respective IDCs 28. These traces generate self-inductances L1, L2, L3, L4, L5, L6, L7, and L8, wherein inductances L1-L8 correspond to the individual traces S1-S8, respectively. Additionally, the PCB 126 includes traces to connect signal traces S1, S2, S3, S6, S7, and S8 to capacitors C12, C36, and C78. In alternate embodiments, capacitors C12, C36, and C78 may be realized by way of distributed capacitive coupling; discrete elements, including, but not limited to, pad capacitors and finger capacitors; or any combination of distributed capacitive coupling and discrete elements. Additionally, capacitors C12, C36, and C78 may be referred to as "shunt capacitors." Furthermore, the traces connecting the signal traces S1, S2, S3, S6, S7, and S8 to capacitors C12, C36, and C78 may be referred to as "offshoot traces." These offshoot traces may span more than a single layer of the PCB 126 and can includes interconnecting vias such as the vias for PIC conductors 1, 2, 3, 6, 7, and 8. At least some of the offshoot traces comprise traces OCN1, OCN2, OCN3, OCN6, OCN7, and OCN8, which create self-inductances LOCN1, LOCN2, LOCN3, LOCN6, LOCN7, and LOCN8, respectively. References to the offshoot, S, and OCN traces may include any portions thereof, including portions which are wider and/or narrower with respect to the general width of any respective trace (for example, portions which may be said to form a part of a pad capacitor).

The result of the signal S traces being within a proximity to the OCN traces is mutual inductive coupling occurring between respective S and OCN traces. In particular, MOCN46 in PCB 126 is the mutual inductive coupling between S4 (L4) and OCN6 (LOCN6); MOCN35 in PCB 126 is the mutual inductive coupling between S5 (L5) and OCN3 (LOCN3); MOCN13 in PCB 126 is the mutual inductive coupling between S3 (L3) and OCN1 (LOCN1); MOCN26 in PCB 126 is the mutual inductive coupling between S6 (L6) and OCN2 (LOCN2); MOCN37 in PCB 126 is the mutual inductive coupling between S3 (L3) and OCN7 (LOCN7); and MOCN68 in PCB 126 is the mutual inductive coupling between S6 (L6) and OCN8 (LOCN8). Another result of the S traces being within a proximity to the OCN traces is capacitive coupling between respective S and OCN traces (including sections which may be referred to as pad capacitors). In particular, C46 in PCB 126 is the capacitive coupling between traces S4 and OCN6 (including the section which may be referred to as pad capacitor C46P); C35 in PCB 126 is the capacitive coupling between traces S5 and OCN3 (including the section which may be referred to as pad capacitor C35P); C13 in PCB 126 is the capacitive coupling between traces S3 and OCN1 (including the section which may be referred to as pad capacitor C13P); C26 in PCB 126 is the capacitive coupling between traces S6 and OCN2 (including the section which may be referred to as pad capacitor C26P); C37 in PCB 126 is the capacitive coupling between traces S3 and OCN7 (including the section which may be referred to as pad capacitor C37P); and C68 in PCB 126 is the capacitive coupling between traces S6 and OCN8 (including the section which may be referred to as pad capacitor C68P). While the sections that may be referred to as pad capacitors are shown as parts of the S and OCN traces, other embodiments may show these sections as distinct elements which may electrically contact the S or OCN traces, but not necessarily be a part of them.

For wire-pair combination 4:5-3:6, the orthogonal compensation network located on the PCB 126 uses traces S4, S5, OCN3, and OCN6, and capacitor C36 to create the desired signal. Traces S4 and OCN6 (including the section which may be referred to as pad capacitor C46P) create capacitive coupling C46 which is approximately 0.75 pF+/−20%, and traces S5 and OCN3 (including the section which may be referred to as pad capacitor C35P) create capacitive coupling C35 which is approximately 0.65 pF+/−20%. Capacitive couplings C46 and C35 together produce a net compensation vector $A_1$ of an opposite polarity of the offending crosstalk vector $A_0$ (see FIG. 1A for reference). Capacitor C36 (approximately 1.08 pF+/−20%) provides a current path between traces OCN3 and OCN6, allowing mutual inductive coupling MOCN46 (approximately 4.2 nH+/−20%) to occur between traces S4 and OCN6, and mutual inductive coupling MOCN35 (approximately 3.2 nH+/−20%) to occur between traces S5 and OCN3. Inductive couplings MOCN46 and MOCN35 are created in generally the same physical locations as capacitive couplings C46 and C35, and together, in combination with capacitor C36, produce a net compensation vector $B_1$ (see FIG. 1A for reference). Because of the C36 capacitor, vector $B_1$ is phase-shifted and becomes orthogonal to compensation vector $A_1$ produced by the C35 and C46 capacitive couplings. The net resultant vector of couplings C35, C46, MOCN35, MOCN46, and C36 provides additional NEXT bandwidth which may help to allow wire-pair combination 4:5-3:6 to meet standards for Category 5E and beyond.

For wire-pair combination 3:6-1:2, the orthogonal compensation network located on the PCB 126 uses traces S3, S6, OCN1, and OCN2, and capacitor C12 to create the desired signal. Traces S3 and OCN1 (including the section which may be referred to as pad capacitor C13P) create capacitive coupling C13 which is approximately 0.4 pF+/−20%, and traces S6 and OCN2 (including the section which may be referred to as pad capacitor C26P) create capacitive coupling C26 which is approximately 0.3 pF+/−20%. Capacitive couplings C13 and C26 together produce a net compensation vector $A_1$ of an opposite polarity of the offending crosstalk vector $A_0$ (see FIG. 1A for reference). Capacitor C12 (approximately 1.9 pF+/−20%) provides a current path between traces OCN1 and OCN2, allowing mutual inductive coupling MOCN13 (approximately 1.9 nH+/−20%) to occur between traces S3 and OCN1, and mutual inductive coupling MOCN26 (approximately 0.8 nH+/−20%) to occur between traces S6 and OCN2. Inductive couplings MOCN13 and MOCN26 are created in generally the same physical locations as capacitive couplings C13 and C26, and together, in combination with capacitor C12, produce a net compensation vector $B_1$ (see FIG. 1A for reference). Because of the C12 capacitor, vector $B_1$ is phase-shifted and becomes orthogonal to the compensation vector $A_1$ produced by the C13 and C26 capacitive couplings. The net resultant vector of couplings C13, C26, MOCN13, MOCN26, and C12 provides additional NEXT bandwidth which may help to allow wire-pairs 3:6-1:2 to meet standards for Category 5E and beyond.

For wire-pair combination 3:6-7:8, the orthogonal compensation network located on the PCB 126 uses traces S3, S6, OCN7, and OCN8, and capacitor C78 to create the desired signal. Traces S3 and OCN7 (including the section which may be referred to as pad capacitor C37P) create capacitive coupling C37 which is approximately 0.44 pF+/−20%, and traces S6 and OCN8 (including the section which may be referred to as pad capacitor C68P) create capacitive coupling C68 which is approximately 0.47 pF+/−20%. Capacitive couplings C37 and C68 together produce a net compensation vector $A_1$ of an opposite polarity of the offending crosstalk vector $A_0$ (see FIG. 1A for reference). Capacitor C78 (approximately 0.86 pF+/−20%) provides a current path between traces OCN7 and OCN8, allowing mutual inductive coupling MOCN37 (approximately 1.3 nH+/−20%) to occur between traces S3 and OCN7, and mutual inductive coupling MOCN68 (approximately 1.1 nH+/−20%) to occur between traces S6 and OCN8. Inductive couplings MOCN37 and MOCN68 are created in generally the same physical locations as capacitive couplings C37 and C68, and together, in combination with capacitor C78, produce a net compensation vector $B_1$ (see FIG. 1A for reference). Because of the C78 capacitor, vector $B_1$ is phase-shifted and becomes orthogonal to the compensation vector $A_1$ produced by the C37 and C68 capacitive couplings. The net resultant vector of couplings C37, C68, MOCN37, MOCN68, and C78 provides additional NEXT bandwidth which may help to allow wire-pairs 3:6-7:8 to meet standards for Category 5E and beyond.

For wire-pair combination 4:5-1:2, the PCB 126 provides a compensation vector of an opposite polarity to the offending crosstalk vector. The coupling on the PCB 126 represented by the compensation vector is created by the mutual inductive coupling created by the proximity of traces S1 and S4. This coupling may help to allow wire-pair combination 4:5-1:2 to meet standards for Category 5E and beyond.

For wire-pair combination 4:5-7:8, the PCB 126 provides a compensation vector of opposite polarity to the offending crosstalk vector. This vector is produced by the coupling occurring at the C58 capacitor (approximately 0.47 pF+/−20%). In alternate embodiments, capacitor C58 may be realized by way of distributed capacitive coupling; discrete elements, including, but not limited to, pad capacitors and finger capacitors; or any combination of distributed capacitive coupling and discrete elements. Capacitor C58 may help to allow wire-pair combination 4:5-7:8 to meet standards for Category 5E and beyond.

A summary of the circuit elements of PCB 126 and how they generally relate to vectors $A_1$ and $B_1$ is given in Table 2 below.

TABLE 2

Relationship of PCB 126 Circuit Elements and $A_1$ and $B_1$ Vectors:

| Pair Combination | $A_1$ Vector | $B_1$ Vector | |
|---|---|---|---|
| | | Capacitor | Mutual Inductive Coupling |
| 4:5-3:6 | C35, C46 | C36 | MOCN35, MOCN46 |
| 3:6-1:2 | C13, C26 | C12 | MOCN13, MOCN26 |
| 3:6-7:8 | C68, C37 | C78 | MOCN68, MOCN37 |
| 4:5-1:2 | M14 | N/A | N/A |
| 4:5-7:8 | C58 | N/A | N/A |
| 1:2-7:8 | N/A | N/A | N/A |

The effect of printed circuit board 126 on the overall measured NEXT of a mated plug and jack using PCB 126 is shown in FIGS. 11A-11C for wire-pair combinations (4:5-3:6 [FIG. 11A], 3:6-1:2 [FIG. 11B], and 3:6-7:8 [FIG. 11C]) with orthogonal compensation networks according to embodiments of the present invention. Each graph shows two lines due to the fact the jack must meet a NEXT specification from ANSI/TIA-568-C.2 for a specified range of plug crosstalk (low plug and high plug). In relation to the lumped approximation model of FIG. 1A, the combination of compensating crosstalk vector $A_1$ with orthogonal vector $B_1$ for jack 12 with PCB 126 can have the effect of creating additional cancellation (sometimes referred to as a null or dip in the NEXT response) at higher frequencies, which can have the effect of increasing the overall NEXT bandwidth. Wire-pair 4:5-3:6 has additional cancellation 128 on the low plug at about 200 MHz, wire-pair 3:6-1:2 has additional cancellation 130 around 250 MHz, and wire-pair 3:6-7:8 has additional cancellation 132 around 230 MHz.

In addition to the modular style jack 12 shown, the present invention can be adapted to other style jacks with different PIC and/or IDC and/or housing or other geometries such as leadframe, punch-down, shielded, shuttered door, keyed, etc.

Note that while this invention has been described in terms of several embodiments, these embodiments are non-limiting (regardless of whether they have been labeled as exemplary or not), and there are alterations, permutations, and equivalents, which fall within the scope of this invention. Furthermore, it should be understood that any graphs shown herein are not intended to be limiting of the present invention. Instead, these graphs are to be understood as exemplary, illustrating the generalized representation of the performance of the present invention according to only some of the embodiments. It should also be noted that there are many alternative ways of implementing the methods and apparatuses of the present invention. It is therefore intended that claims that may follow be interpreted as including all such alterations, permutations, and equivalents as fall within the true spirit and scope of the present invention.

We claim:

1. A circuit for crosstalk compensation, said circuit comprising:
a first, a second, a third, and a fourth signal conductors, said first and said fourth signal conductors forming a first signal-pair, and said second and said third signal conductors forming a second signal-pair; and
a first offshoot conductor having a first end and a second end, said first end of said first offshoot conductor being connected to said second signal conductor and said second end of said first offshoot conductor being capacitively coupled to said third signal conductor,
wherein a first capacitive coupling and a first mutual inductive coupling occur between at least a portion of said first signal conductor and at least a portion of said first offshoot conductor.

2. The circuit of claim 1, wherein said second end of said first offshoot conductor is capacitively coupled to said third signal conductor via a capacitor.

3. The circuit of claim 2, wherein said capacitor includes a first capacitor member and a second capacitor member, said first capacitor member being connected to said second end of said first offshoot conductor and said second capacitor member being comprised of at least a portion of said third signal conductor.

4. The circuit of claim 2, wherein said capacitor includes a first capacitor member and a second capacitor member, said first capacitor member being connected to said second end of said first offshoot conductor and said second capacitor member being connected to a second offshoot conductor, said second offshoot conductor having a first end and a second end, said first end of said second offshoot conductor being connected to said third signal conductor and said second end of said second offshoot conductor being connected to said second capacitor member,
wherein at least one of capacitive coupling and mutual inductive coupling does not occur between said fourth signal conductor and said second offshoot conductor.

5. The circuit of claim 2, wherein said capacitor is at least one of a finger capacitor and a pad capacitor.

6. The circuit of claim 1, wherein said second end of said first offshoot conductor is capacitively coupled to said third signal conductor via distributed capacitive coupling.

7. The circuit of claim 1, wherein at least one of said first capacitive coupling and said first mutual inductive coupling is achieved by at least one of distributed coupling and discrete coupling element.

8. The circuit of claim 1, wherein said first capacitive coupling and said first mutual inductive coupling occur at an approximately same time.

9. The circuit of claim 1, wherein a signal produced by said first mutual inductive coupling is phase-shifted approximately 90 degrees relative to a signal produced by said first capacitive coupling.

10. The circuit of claim 1, wherein
said second signal conductor is connected to a first source impedance,
said third signal conductor is connected to a second source impedance, and
said first source impedance, said second source impedance, and said capacitive coupling between said second end of said first offshoot conductor and said third signal conductor comprise a resistor-capacitor circuit,
said resistor-capacitor circuit being excited in response to a signal transmitted on said first signal conductor.

11. The circuit of claim 1, wherein said circuit is implemented on at least one of a printed circuit board and a lead frame.

12. A communication jack, comprising:
a first, a second, a third, and a fourth signal conductors, each of said first, said second, said third, and said fourth signal conductors having a respective plug interface contact, a respective insulation displacement contact, and a respective signal trace connecting said respective plug interface contact to said respective insulation displacement contact, said first and said fourth signal conductors forming a first signal-pair, and said second and said third signal conductors forming a second signal-pair; and a first offshoot conductor having a first end and a second end, said first end of said first offshoot conductor being connected to said second signal conductor and said second end of said first offshoot conductor being capacitively coupled to said third signal conductor, wherein a first capacitive coupling and a first mutual inductive coupling occur between at least a portion of said first signal conductor and at least a portion of said first offshoot conductor.

13. The communication jack of claim 12, wherein said second end of said first offshoot conductor is capacitively coupled to said third signal conductor via a capacitor.

14. The communication jack of claim 13, wherein said capacitor includes a first capacitor member and a second capacitor member, said first capacitor member being connected to said second end of said first offshoot conductor and said second capacitor member being comprised of at least a portion of said third signal conductor.

15. The communication jack of claim 13, wherein said capacitor includes a first capacitor member and a second capacitor member, said first capacitor member being connected to said second end of said first offshoot conductor and said second capacitor member being connected to a second offshoot conductor, said second offshoot conductor having a first end and a second end, said first end of said second offshoot conductor being connected to said third signal conductor and said second end of said second offshoot conductor being connected to said second capacitor member, wherein at least one of capacitive coupling and mutual inductive coupling does not occur between said fourth signal conductor and said second offshoot conductor.

16. The communication jack of claim 13, wherein said capacitor is at least one of a finger capacitor and a pad capacitor.

17. The communication jack of claim 12, wherein said second end of said first offshoot conductor is capacitively coupled to said third signal conductor via distributed capacitive coupling.

18. The communication jack of claim 12, wherein at least one of said first capacitive coupling and said first mutual inductive coupling is achieved by at least one of distributed coupling and discrete coupling element.

19. The communication jack of claim 12, wherein said first capacitive coupling and said first mutual inductive coupling occur at an approximately same time.

20. The communication jack of claim 12, wherein a signal produced by said first mutual inductive coupling is phase-shifted approximately 90 degrees relative to a signal produced by said first capacitive coupling.

21. The communication jack of claim 12, wherein
said second signal conductor is connected to a first source impedance,
said third signal conductor is connected to a second source impedance, and
said first source impedance, said second source impedance, and said capacitive coupling between said second end of said first offshoot conductor and said third signal conductor comprise a resistor-capacitor circuit,
said resistor-capacitor circuit being excited in response to a signal transmitted on said first signal conductor.

22. The communication jack of claim 12, further comprising a printed circuit board, wherein at least a part of each of said first, said second, said third, and said fourth signal traces is positioned on said printed circuit board, and
wherein at least a part of said first offshoot conductor is positioned on said printed circuit board.

23. The communication jack of claim 12, wherein said jack is mateable to a corresponding plug producing some amount of plug crosstalk, and wherein said first capacitive coupling and said first mutual inductive coupling occur at an approximately same distance from said plug crosstalk.

24. The communication jack of claim 12, wherein said respective signal traces are formed as at least one of printed circuit board traces and leadframe traces.

25. A communication system comprising:
a communication equipment; and
a communication jack installed in said communication equipment, said communication jack including:
a first, a second, a third, and a fourth signal conductors, each of said first, said second, said third, and said fourth signal conductors having a respective plug interface contact, a respective insulation displacement contact, and a respective signal trace connecting said respective plug interface contact to said respective insulation displacement contact,
said first and said fourth signal conductors forming a first signal-pair, and said second and said third signal conductors forming a second signal-pair; and
a first offshoot conductor having a first end and a second end, said first end of said first offshoot conductor being connected to said second signal conductor and said second end of said first offshoot conductor being capacitively coupled to said third signal conductor,
wherein a first capacitive coupling and a first mutual inductive coupling occur between at least a portion of said first signal conductor and at least a portion of said first offshoot conductor.

26. A method for compensating for undesired crosstalk within a communication jack having a first, a second, a third, and a fourth signal conductors, said first and said fourth signal conductors forming a first signal-pair, and said second and said third signal conductors forming a second signal-pair, said method comprising the steps of:
providing a first offshoot conductor having a first end and a second end;
connecting said first end of said first offshoot conductor to said second signal conductor;
capacitively coupling said second end of said first offshoot conductor with said third signal conductor; and
capacitively and mutual-inductively coupling at least a portion of said first signal conductor with at least a portion of said first offshoot conductor, producing a first capacitive signal and a first mutual inductive signal, respectively.

27. The method of claim 26, wherein the step of capacitively coupling said second end of said first offshoot conductor with said third signal conductor causes said first mutual inductive signal to be phase-shifted approximately 90 degrees relative to said first capacitive signal.

28. A communication connector, comprising:
plug interface contacts including a plurality of conductor pairs;
cable connector contacts; and
a printed circuit board connecting said plug interface contacts to respective said cable connector contacts, said printed circuit board including circuitry between a first said conductor pair and a second said conductor pair,
said circuitry including a first mutually inductive coupling between a first conductor of said first conductor pair and a first conductor of said second conductor pair, and a first capacitive coupling between said first conductor of said first conductor pair and said first conductor of said second conductor pair, said first capacitive coupling approximately concurrent with said first mutually inductive coupling, and said circuitry being capacitively coupled to a second conductor of said second conductor pair.

29. The communication connector of claim 28, wherein said printed circuit board including input terminals connected to respective plug interface contacts and output terminals connected to respective cable connector contacts, said first conductor of said first conductor pair and said second conductor of said first conductor pair connecting respective said input terminals to respective said output terminals.

30. The communication connector of claim 28, further including a predetermined NEXT requirement over a frequency range of interest, wherein values of said first mutually inductive coupling and said capacitive coupling between said circuitry and said second conductor of said second conductor pair are chosen to produce additional cancellation in said NEXT.

31. The communication connector of claim 30, wherein said additional cancellation occurs in said frequency range of interest.

32. The communication connector of claim 30, wherein a value of said first capacitive coupling is chosen so that said connector has improved NEXT when compared to said predetermined NEXT requirement.

33. The communication connector of claim 28, wherein said plug interface contacts have predetermined couplings between said plurality of conductor pairs, said first capacitive coupling dependent on said predetermined couplings.

34. The communication connector of claim 28, wherein said first mutually inductive coupling is distributed mutual inductance, and said first capacitive coupling is distributed capacitance.

35. A communication system, comprising:
communication equipment; and
a communication connector connected to said communication equipment, the communication connector including plug interface contacts having a plurality of conductor pairs, cable connector contacts, and a printed circuit board connecting said plug interface contacts to respective said cable connector contacts, said printed circuit board including circuitry between a first said conductor pair and a second said conductor pair,
said circuitry including a first mutually inductive coupling between a first conductor of said first conductor pair and a first conductor of said second conductor pair, and a first capacitive coupling between said first conductor of said first conductor pair and said first conductor of said second conductor pair, said first capacitive coupling approximately concurrent with said first mutually inductive coupling, and
said circuitry being capacitively coupled to a second conductor of said second conductor pair.

36. The communication system of claim 35, wherein said printed circuit board including input terminals connected to respective plug interface contacts and output terminals connected to respective cable connector contacts, said first conductor of said first conductor pair and said second conductor of said first conductor pair connecting respective said input terminals to respective said output terminals.

37. The communication system of claim 35, further including a predetermined NEXT requirement over a frequency range of interest, wherein values of said first mutually inductive coupling and said capacitive coupling between said circuitry and said second conductor of said second conductor pair are chosen to produce additional cancellation in said NEXT.

38. The communication system of claim 37, wherein said additional cancellation occurs in said frequency range of interest.

39. The communication system of claim 37, wherein a value of said first capacitive coupling is chosen so that said connector has improved NEXT when compared to said predetermined NEXT requirement.

40. The communication system of claim 35, wherein said plug interface contacts have predetermined couplings between said plurality of conductor pairs, said first capacitive coupling dependent on said predetermined couplings.

41. The communication system of claim 35, wherein said first mutually inductive coupling is distributed mutual inductance, and said first capacitive coupling is distributed capacitance.

42. A method of compensation between a plurality of conductor pairs in a communication jack, comprising the steps of:
providing a connector including plug interface contacts, cable connector contacts, first circuitry having a plurality of conductor pairs connecting respective said plug interface contacts and respective said cable connector contacts, and second circuitry connected to at least some of said first circuitry;
capacitive coupling and mutually inductive coupling a first conductor of a first conductor pair to a first conductor of a second conductor pair to produce a first capacitive coupling and a first mutually inductive coupling, respectively, via said second circuitry; and
shifting a phase of the first mutually inductive coupling to be approximately orthogonal to the first capacitive coupling by capacitively coupling said second circuitry to a second conductor of said first conductor pair via a second capacitive coupling.

43. The method of claim 42, further including the step of selecting: a value of the second capacitive coupling, a value of said first capacitive coupling, and a value of said first mutually inductive coupling; each of said values selected to produce an additional cancellation in NEXT.

44. The method of claim 43, wherein said NEXT includes a requirement in a frequency range of interest, said additional cancellation occurring within said range.

45. The method of claim 42, wherein said first capacitive coupling is a discrete circuit element.

46. The method of claim 42, wherein said first capacitive coupling includes a discrete circuit element and a distributed circuit element.

47. The method of claim 42, wherein said compensation is a crosstalk compensation.

* * * * *